(12) United States Patent
Yamazaki et al.

(10) Patent No.: US 10,710,288 B2
(45) Date of Patent: Jul. 14, 2020

(54) MOLDED PRODUCT, ELECTRICAL PRODUCT, AND METHOD FOR MANUFACTURING MOLDED PRODUCT

(71) Applicant: NISSHA CO., LTD., Kyoto-shi, Kyoto (JP)

(72) Inventors: Seiichi Yamazaki, Kyoto (JP); Toshihiro Higashikawa, Kyoto (JP); Hitoshi Hirai, Kyoto (JP)

(73) Assignee: NISSHA CO., LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 16/620,286

(22) PCT Filed: Jul. 19, 2018

(86) PCT No.: PCT/JP2018/027102
§ 371 (c)(1),
(2) Date: Dec. 6, 2019

(87) PCT Pub. No.: WO2019/026636
PCT Pub. Date: Feb. 7, 2019

(65) Prior Publication Data
US 2020/0101646 A1 Apr. 2, 2020

(30) Foreign Application Priority Data
Aug. 3, 2017 (JP) ................................. 2017-150760

(51) Int. Cl.
*H05K 3/10* (2006.01)
*H05K 7/00* (2006.01)
(Continued)

(52) U.S. Cl.
CPC .. *B29C 45/14467* (2013.01); *B29C 45/14688* (2013.01); *H05K 1/189* (2013.01);
(Continued)

(58) Field of Classification Search
CPC .. H05K 3/10; H05K 7/00; H05K 7/02; H05K 13/04; H01Q 1/38
(Continued)

(56) References Cited

U.S. PATENT DOCUMENTS 9,872,409 B2 *   1/2018   Isoda ........................ H05K 7/00
2010/0271265 A1 * 10/2010 Sung ................. B29C 45/14639
343/700 MS
(Continued)

FOREIGN PATENT DOCUMENTS

JP          5484529 B2      5/2014
JP          2016196154 A    11/2016

*Primary Examiner* — Xiaoliang Chen
(74) *Attorney, Agent, or Firm* — Alleman Hall Creasman & Tuttle LLP

(57) ABSTRACT

A molded product and an electrical product comprising a molded article that includes a main body made of resin and a standing wall made of resin. The standing wall integrally stands up from the end portion of the main body. A decorative sheet includes a base film and a conductive circuit layer. The base film continuously covers from the main body front surface to a wall front surface. The conductive circuit layer is disposed between the base film and the main body front surface. The decorative sheet is integrated with the molded article to implement a decoration with the base film. A flexible printed circuit board is disposed between the molded article and the conductive circuit layer. The flexible printed circuit board is partially embedded into and integrated with the standing wall. The flexible printed circuit board is electrically connected to the conductive circuit layer.

11 Claims, 26 Drawing Sheets

(51) Int. Cl.

| | |
|---|---|
| *H05K 7/02* | (2006.01) |
| *H05K 13/04* | (2006.01) |
| *H01Q 1/38* | (2006.01) |
| *B29C 45/14* | (2006.01) |
| *H05K 1/18* | (2006.01) |
| *H05K 3/32* | (2006.01) |
| *B29L 31/34* | (2006.01) |
| *G06F 3/041* | (2006.01) |
| *H04N 5/225* | (2006.01) |

(52) U.S. Cl.
CPC .......... *H05K 3/321* (2013.01); *B29L 2031/34* (2013.01); *G06F 3/041* (2013.01); *H04N 5/2251* (2013.01); *H05K 2203/1327* (2013.01)

(58) Field of Classification Search
USPC .......... 361/749, 728, 757; 29/825; 264/104, 264/272.15
See application file for complete search history.

(56) References Cited

U.S. PATENT DOCUMENTS

| | | | |
|---|---|---|---|
| 2014/0016048 A1* | 1/2014 | Omote | G06F 3/0412 349/12 |
| 2014/0043771 A1* | 2/2014 | Isoda | H05K 7/02 361/728 |
| 2015/0103503 A1* | 4/2015 | Yamazaki | B29C 45/14467 361/757 |
| 2016/0111485 A1* | 4/2016 | Chida | H01L 51/5246 257/40 |

\* cited by examiner

MOLDED PRODUCT, ELECTRICAL PRODUCT, AND METHOD FOR MANUFACTURING MOLDED PRODUCT

CROSS REFERENCES TO RELATED APPLICATIONS

This application is a national phase application of International Application No. PCT/JP2018/027102, filed on Jul. 19, 2018 which claims priority to Japanese Patent Application No. 2017-150760, filed on Aug. 3, 2017, the entire disclosures of each of which are incorporated herein by reference for all purposes.

TECHNICAL FIELD

The present disclosure relates to a molded product in which a decorative sheet including a conductive circuit layer is integrated with a molded article, an electrical product including this molded product, and a method for manufacturing the molded product.

BACKGROUND

In a related art, an electrical product using an electrical component sheet such as a sheet-like flexible touch sensor has been manufactured. For example, Patent Literature 1 discloses a technique that integrates a sheet-like touch sensor with a molded article of thermoplastic resin during injection molding to manufacture a component module with a touch sensor.

CITATION LIST

Patent Literature

Patent Literature 1: JP 5484529 B

SUMMARY

For example, in the component module described in Patent Literature 1, a functional circuit that functions as a touch sensor or the like is integrated with an external connecting portion for connecting the functional circuit to an external device or the like. When the functional circuit and the external connecting portion are integrated in a decorative sheet in this way, integration with the molded article is required using the decorative sheet including the functional circuit and the external connecting portion. To manufacture the component module described in Patent Literature 1, in preforming, the decorative sheet needs to be preformed with the external connecting portion included. This makes the preforming difficult and it is difficult to aesthetically finish an appearance of the molded product. In addition, for example, in the injection molding where the functional circuit and the external connecting portion are sandwiched between molds by in-mold molding, a situation where a pressure causing disconnection between the functional circuit and the external connecting portion is applied frequently occurs in the manufacturing process of the component module; therefore, the disconnection of the external connecting part becomes a problem.

An object of the present disclosure is to provide a molded product and an electrical product including a molded article integrated with a decorative sheet including a conductive circuit layer, which has an aesthetic appearance and is less likely to be disconnected.

Solution to Problem

Some aspects are described below as the means to solve the problems. These aspects can be combined optionally, as needed.

A molded product according to one aspect of the present disclosure includes a molded article, a decorative sheet, and a flexible printed circuit board. The molded article includes a main body made of resin and a standing wall made of resin. The standing wall integrally stands up from an end portion of the main body. The decorative sheet includes a base film and a conductive circuit layer. The base film continuously covers from a main body front surface of the main body to a wall front surface of the standing wall. The conductive circuit layer is disposed between the base film and a molded article front surface of the molded article. The decorative sheet is integrated with the molded article to implement a decoration. The flexible printed circuit board is disposed between the molded article and the conductive circuit layer. The flexible printed circuit board is partially embedded into and integrated with the standing wall. The flexible printed circuit board is electrically connected to the conductive circuit layer.

Furthermore, with the molded product, an electrical connecting part for the flexible printed circuit board and the conductive circuit layer may be laminated on the wall front surface.

Furthermore, with the molded product, the conductive circuit layer may include an electrode of a sensor.

Furthermore, with the molded product, the decorative sheet and the flexible printed circuit board may be wrapped around and fixed so as to be inclined inward with respect to an inclined direction of the wall front surface of the standing wall.

Furthermore, the molded product may further include a fixing portion made of resin that annularly covers the flexible printed circuit board together with the molded article in at least a part of the flexible printed circuit board.

Furthermore, an electric product according to one aspect of the present disclosure includes the above-described molded product and an electrical device electrically connected to the flexible printed circuit board of the molded product.

In a method for manufacturing a molded product according to one aspect of the present disclosure, the molded product includes a molded article and a decorative sheet. The molded article includes a main body and a standing wall made of resin. The standing wall integrally stands up from an end portion of the main body. The decorative sheet includes a base film and a conductive circuit layer. The base film continuously covers from a main body front surface to a wall front surface of the standing wall. The conductive circuit layer is disposed between the base film and a molded article front surface of the molded article. The decorative sheet is integrated with the molded article to implement a decoration. The method includes: preforming the decorative sheet in a shape close to a shape of the molded article; setting the decorative sheet in a recess portion of a first mold such that the base film faces the first mold and disposing an external connecting portion for connecting the conductive circuit layer to an external electrical circuit on an extension of a peripheral wall of the recess portion; clamping the first mold, a second mold, and a third mold, protruding the external connecting portion from a first cavity formed with the recess portion to an external space outside the first cavity, and sandwiching the external connecting portion between the second mold and the third mold; and injecting molten resin into the first cavity to form the molded article integrated with the decorative sheet.

Furthermore, the method for manufacturing the molded product according to one aspect may include forming the external connecting portion by electrically connecting a flexible printed circuit board to the conductive circuit layer with an anisotropic conductive film with a temperature and a pressure at which a shape of the preformed decorative sheet is kept, and fixing the flexible printed circuit board to the decorative sheet.

Furthermore, the method for manufacturing the molded product according to one aspect may include forming a second cavity on a front surface of the external connecting portion and the wall front surface with a fourth mold to inject molten resin into the second cavity so as to form a fixing portion made of resin. The fixing portion annually covers the external connecting portion together with the molded article in at least a part of the external connecting portion.

In a method for manufacturing a molded product according to another aspect of the present disclosure, the molded product includes a molded article and a decorative sheet. The molded article includes a main body and a standing wall made of resin. The standing wall integrally stands up from an end portion of the main body. The decorative sheet continuously covers from a main body front surface of the main body to a wall front surface of the standing wall. The method includes preforming the decorative sheet in a shape close to a shape of the molded article; setting the decorative sheet in a recess portion of a first mold such that the decorative sheet faces the first mold and disposing an extension portion of the decorative sheet extending from a peripheral edge portion of the decorative sheet on the wall front surface; clamping the first mold, a second mold, and a third mold to form a first cavity with the recess portion, and sandwiching a vicinity of a boundary between the peripheral edge portion and the extending portion between the second mold and the third mold; and injecting molten resin into the first cavity to form the molded article integrated with the decorative sheet.

Furthermore, the method for manufacturing the molded product according to another aspect may include forming a second cavity on a surface of the extension portion and the wall front surface with a fourth mold to inject molten resin into the second cavity so as to form a fixing portion made of resin. The fixing portion annularly covers at least a part of the extension portion together with the molded article.

Advantageous Effects of Disclosure

With the molded product, the electrical product, or the method for manufacturing the molded product of the present disclosure, the appearance is aesthetic and disconnection is less likely to occur.

DETAILED DESCRIPTION

First Embodiment

Figure 1:
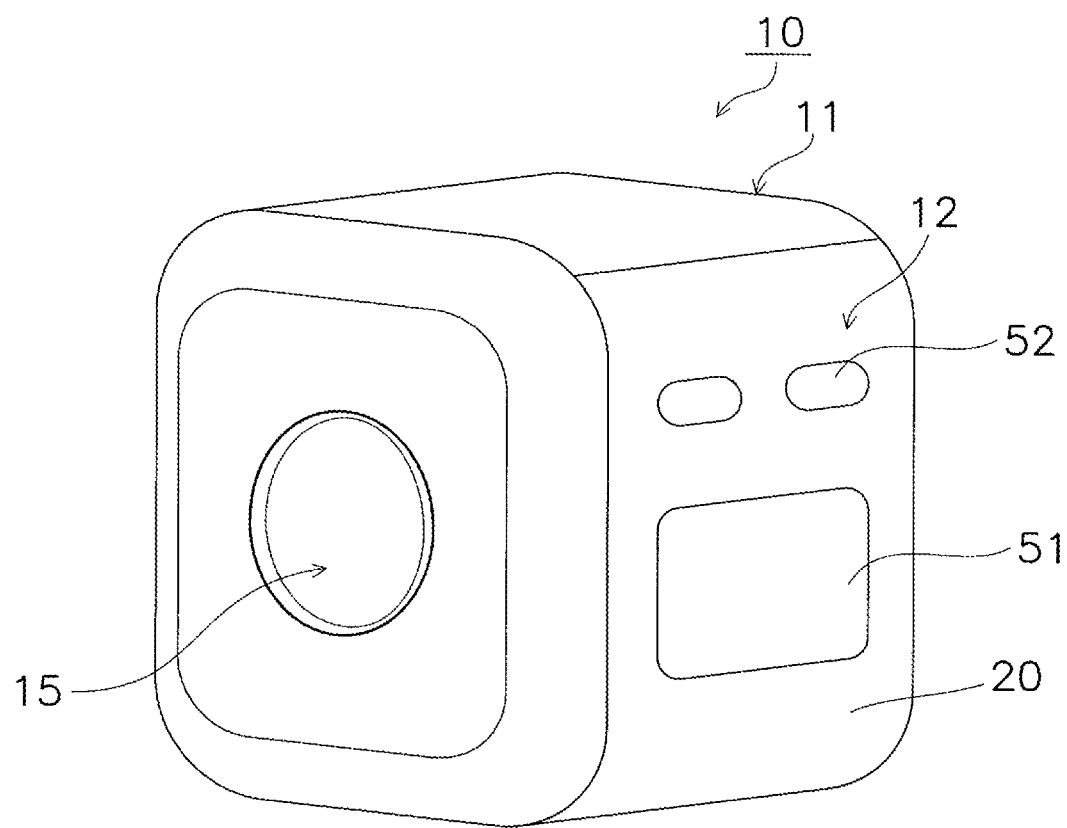
FIG. 1 is a perspective view illustrating an example of a video camera to which a molded product according to a first embodiment is applied.
Figure 2:
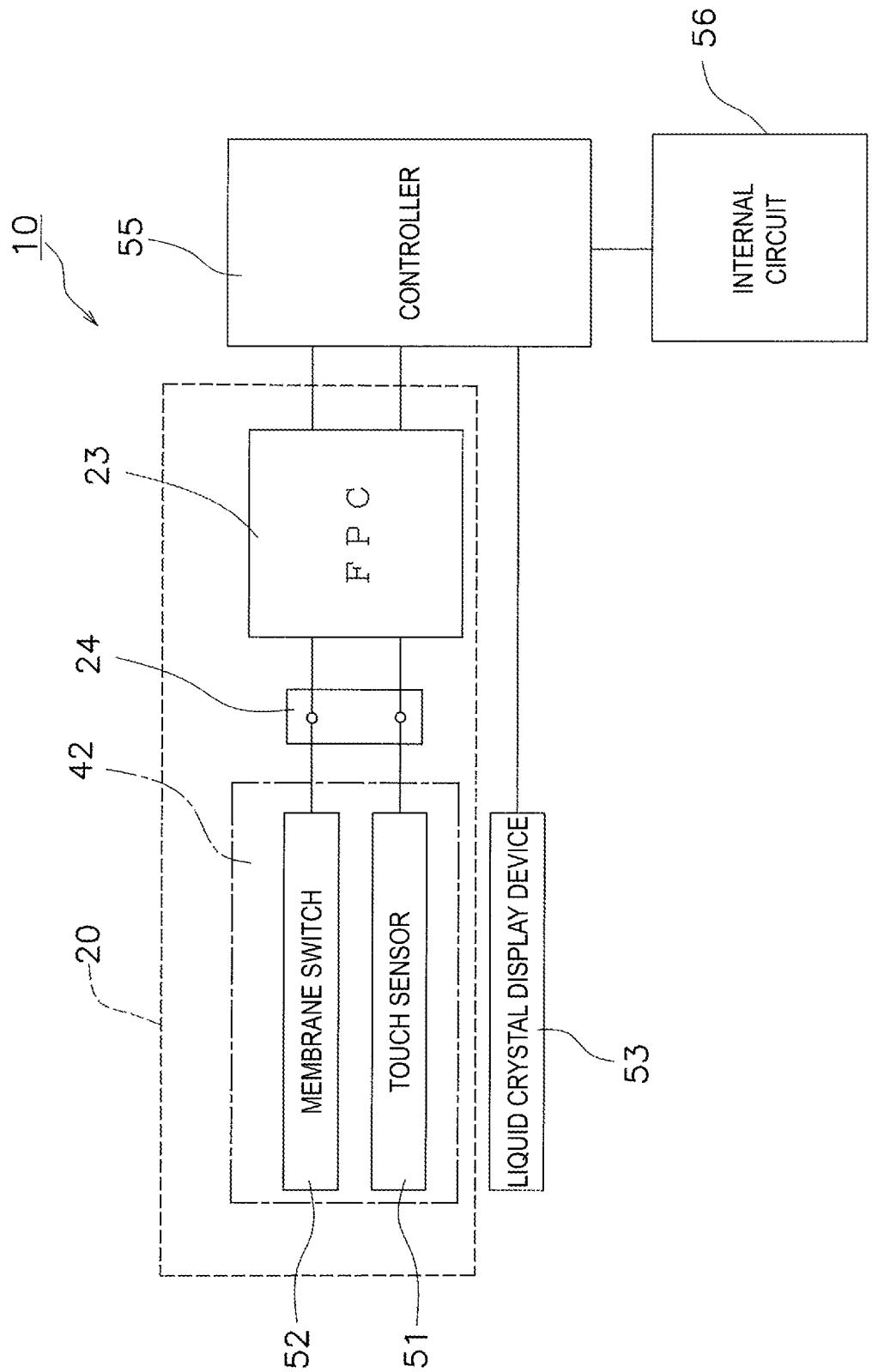
FIG. 2 is a block diagram for describing peripheral devices of the molded product illustrated in FIG. 1.

The following describes a molded product, an electrical product, and a method for manufacturing the molded product according to a first embodiment of the present disclosure with reference to the drawings. FIG. 1 is a perspective view illustrating an overview of a video camera to which the molded product according to the first embodiment of the present disclosure is attached. A video camera 10 illustrated in FIG. 1 is often used outdoors, entry of dust inside of the device needs to be avoided, a waterproofing function is required, and the like, and thus is suitable as an electrical product to which the present disclosure is applied. In the present embodiment, while the video camera 10 is an example of the electrical product to which the present disclosure is applied, the electric product to which the present disclosure is applied is not limited to the video camera 10. A molded product 20 attached to the video camera 10 is a molded product according to the first embodiment of the present disclosure. In this specification, the electrical product is a product including, for example, a product in which a flexible printed circuit board 23 in the molded product 20 is electrically connected to a controller 55 as an electrical device, like the video camera 10 illustrated in FIG. 2. Note that the electrical device is not limited to the controller 55 and only needs to be electrically connected to the molded product 20 to electrically operate.

(1) SUMMARY OF MOLDED PRODUCT 20

To operate the video camera 10, an operating panel 12 is attached to a side surface of a housing 11 of the video camera 10. The operating panel 12 is provided with a touch sensor 51 and membrane switches 52. A liquid crystal display device 53 is provided inside the touch sensor 51. These touch sensor 51 and liquid crystal display device 53 constitute a touch screen. A lens 15 for photographing a video is disposed on a front surface of the video camera 10.

The touch sensor 51 and the membrane switches 52 are included in the molded product 20. The touch sensor 51 and the membrane switches 52 are configured using a conductive circuit layer 42 illustrated in FIG. 3. For example, an electrode of the touch sensor 51 is included in the conductive circuit layer 42, and electrodes of the membrane switches 52 are included in the conductive circuit layer 42. The touch sensor 51 and the membrane switches 52 are connected to the controller 55 with the flexible printed circuit board 23. In the following description, the flexible printed circuit board may be abbreviated as an FPC. The liquid crystal display device 53 is connected to the controller 55 by wiring different from the FPC 23, for example, with a harness or another FPC. The controller 55 is further connected to an internal circuit 56 having a predetermined function, such as a photographing function.

Figure 3:
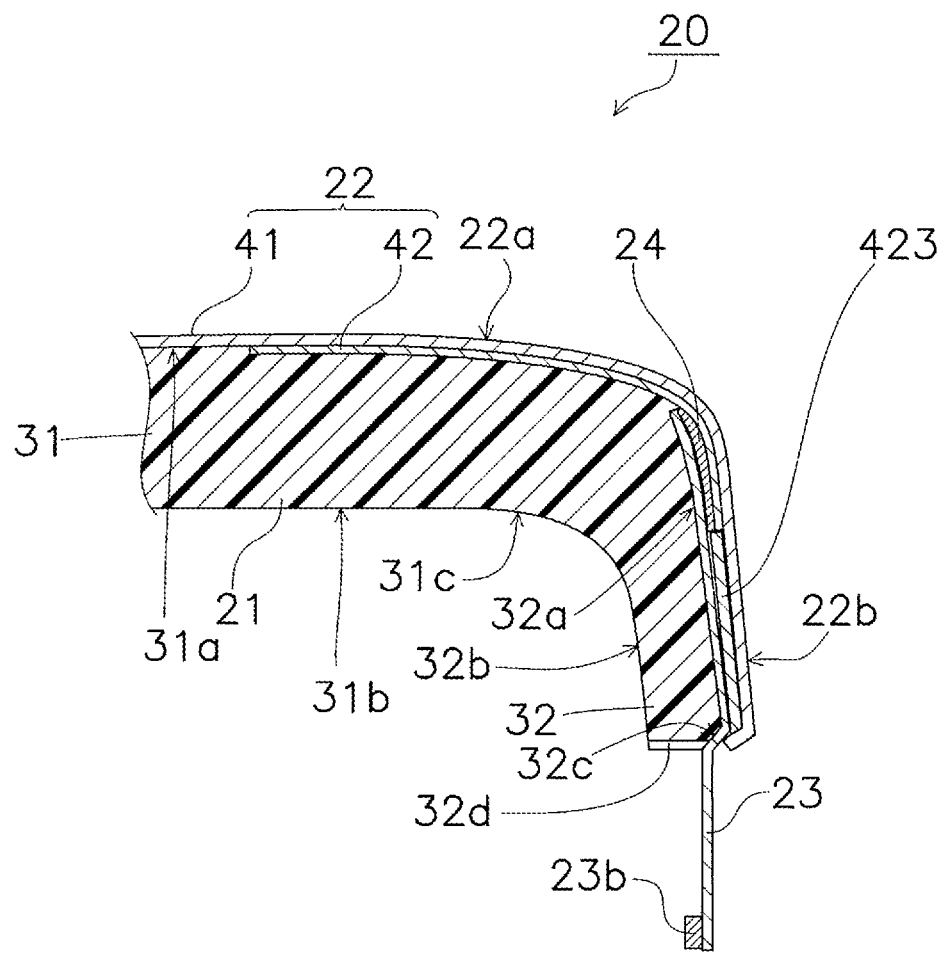
FIG. 3 is a partially enlarged cross-sectional view of the molded product according to the first embodiment.
Figure 4:
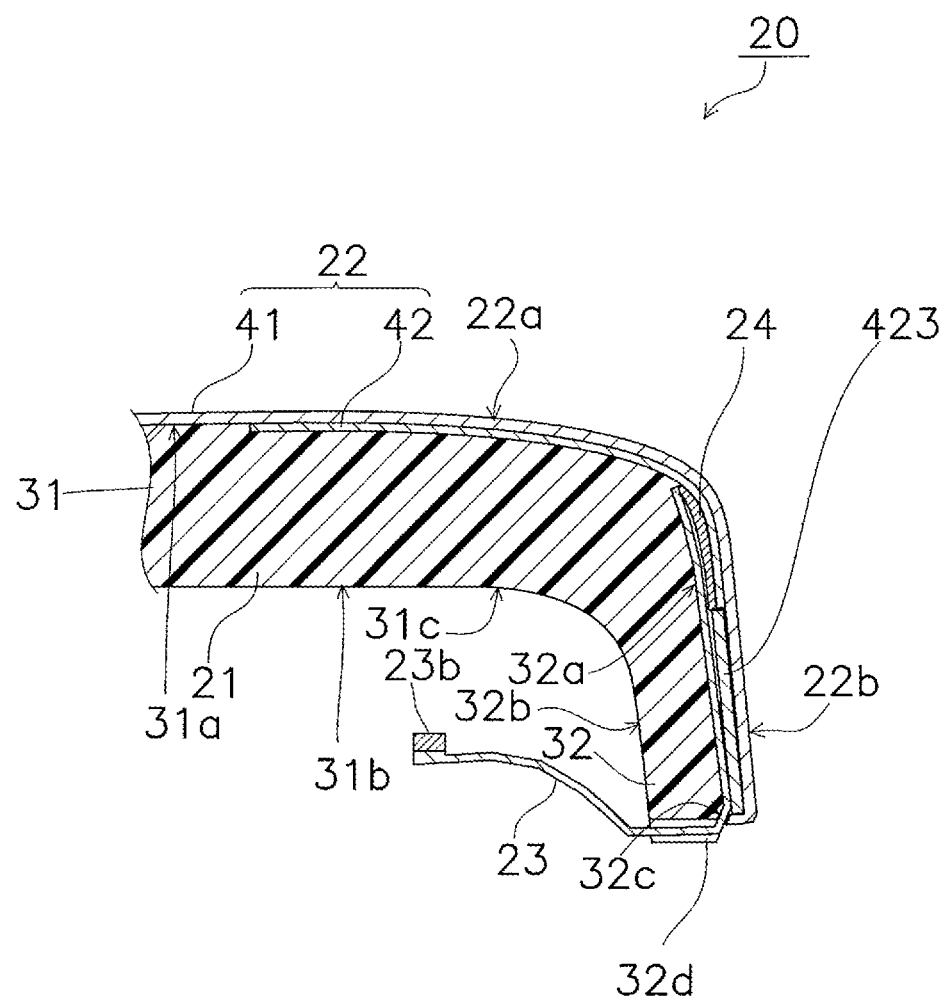
FIG. 4 is a partially enlarged cross-sectional view of the molded product according to the first embodiment.

The molded product 20 is molded by insert molding, and as illustrated in FIGS. 3 and 4, is a component of the video camera 10 in which a molded article 21 made of thermoplastic resin, a decorative sheet 22, and the FPC 23 are integrated. Although here describes the case where the molded product 20 is the component, there may be a case where the molded product itself becomes the product.

The molded article 21 includes a main body 31 made of resin and a standing wall 32 made of resin. Since the molded article 21 is formed by injection molding using the thermoplastic resin, the main body 31 and the standing wall 32 are mainly formed of thermoplastic resin. The standing wall 32 integrally stands up from an end portion 31c of the main body 31. In other words, the standing wall 32 extends to bend in a direction from a main body front surface 31a to a main body back surface 31b of the main body 31.

The decorative sheet 22 includes a front surfacing layer 41 that continuously covers from the main body front surface 31a to a wall front surface 32a of the standing wall 32 and the conductive circuit layer 42 disposed between the front surfacing layer 41 and the main body front surface 31a. The decorative sheet 22 decorates the front surface side of the molded product 20 with the front surfacing layer 41.

The FPC 23 is disposed between the molded article 21 and the conductive circuit layer 42 of the decorative sheet 22. A reinforcing member 23b is provided on a connecting part of the FPC 23 to the outside. In the example illustrated in FIGS. 3 and 4, about a half of one end side, a part of the FPC 23, is embedded into and integrated with the standing wall 32. This FPC 23 is electrically connected to the conductive circuit layer 42 by an anisotropic conductive film 24 on one end side. Accordingly, it can be regarded that the FPC 23 is dented to the molded article 21 together with the anisotropic conductive film 24 and embedded into and integrated with the standing wall 32 together with the anisotropic conductive film 24. Additionally, the FPC 23 is adhered to the decorative sheet 22 with the anisotropic conductive film 24. This anisotropic conductive film 24 is formed using, for example, an anisotropic conductive adhesive and/or an anisotropic conductive film. Note that a connecting pattern 427 (see FIG. 6) for connection to the FPC 23 is formed in the conductive circuit layer 42.

A front surface side end portion 32c of the standing wall 32 in FIG. 3 is inclined inward with respect to an inclined direction of the wall front surface 32a. The decorative sheet 22 and the FPC 23 are wrapped around and fixed so as to be inclined inward with respect to the inclined direction of the wall front surface 32a of the standing wall 32. As illustrated in FIG. 4, the FPC 23 is guided toward a wall back surface 32b through a notch 32d of the standing wall 32 and pulled into the video camera 10. At this time, the bending of the FPC 23 wrapped around and fixed is reduced and the FPC 23 is less likely to be disconnected. In addition, the decorative sheet 22 wrapped around and fixed is also less likely to be turned up.

(2) DECORATIVE SHEET 22

Figure 5:
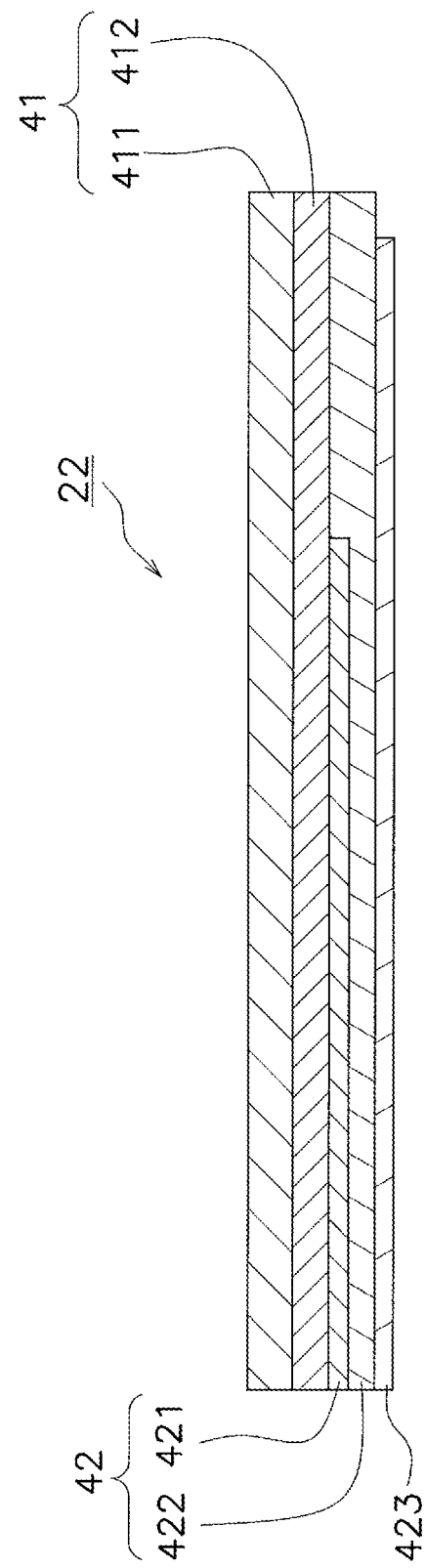
FIG. 5 is a schematic, partially enlarged cross-sectional view for describing a configuration of a decorative sheet.

FIG. 5 illustrates a cross-sectional structure of the decorative sheet 22. The front surfacing layer 41 includes, for example, a base film 411 and a pattern layer 412. The base film 411 is disposed in the uppermost portion of the decorative sheet 22. The pattern layer 412 is formed below the base film 411. Decoration is implemented with this pattern layer 412.

The conductive circuit layer 42 includes, for example, a transparent electrode layer 421 and a thick film conductive layer 422. The transparent electrode layer 421 is formed below the pattern layer 412. The thick film conductive layer 422 is formed below the transparent electrode layer 421. An adhesive layer 423 is formed below the thick film conductive layer 422 except for a part of the decorative sheet 22 electrically connected to the FPC 23.

Figure 6:
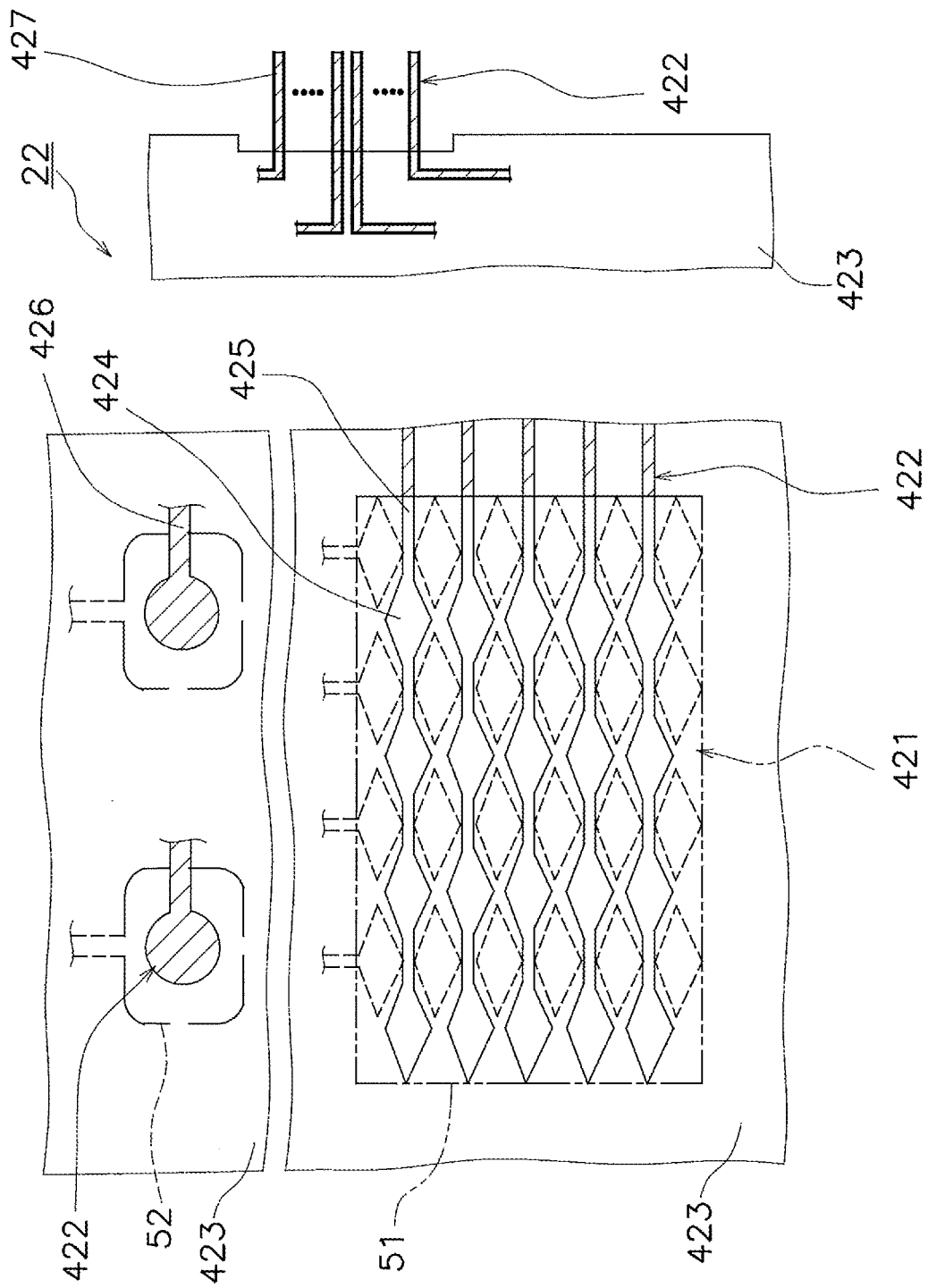
FIG. 6 is a partially broken plan view partially broken for describing a thick film conductive layer and a transparent electrode layer.

FIG. 6 illustrates planar shapes of the transparent electrode layer 421 and the thick film conductive layer 422 formed on the adhesive layer 423. FIG. 6 illustrates the layers below the pattern layer 412 in the decorative sheet 22. An electrode pattern 424 of the touch sensor 51 is formed on the transparent electrode layer 421. In the thick film conductive layer 422, a circuit pattern 425 connected to the electrode pattern 424, electrode patterns and circuit patterns 426 constituting the membrane switches 52, and the connecting pattern 427 are formed.

Furthermore, the decorative sheet 22 includes the adhesive layer 423 for adhesion with the molded article 21 in the bottommost layer.

(2-1) Base Film 411

The base film 411, which is disposed in the uppermost portion of the decorative sheet 22, is a part exposed to the surface of the operating panel 12 illustrated in FIG. 1. Since the pattern layer 412 is disposed below this base film 411 and the touch sensor 51 including the touch sensor 51 and the liquid crystal display device 53 illustrated in FIG. 3 is provided, a transparent resin is used for the base film 411. A material of the base film 411 is selected from, for example, a resin film made of polyester resin, polyethylene terephthalate (PET) resin, acrylic resin, polycarbonate resin, polybutylene terephthalate (PBT) resin, triacetyl cellulose resin, styrene resin, or ABS resin; a multilayer film of acrylic resin and ABS resin; or a multilayer film of acrylic resin and polycarbonate resin. A thickness of the base film 411 is generally selected from a range from, for example, 30 μm to 500 μm.

(2-2) Pattern Layer 412

The pattern layer 412 is a layer for representing a design such as a pattern. The pattern layer 412 is formed in the base film 411 by, for example, gravure printing method or screen printing method. A material constituting the pattern layer 412 includes, for example, resin such as acrylic-based resin, vinyl chloride vinyl acetate copolymer resin, thermoplastic urethane-based resin, and polyester-based resin, and a pigment or a dye added to the resin. Additionally, the pattern layer 412 may be provided with a metal tone design by using, for example, an insulated aluminum paste or mirror ink. Furthermore, a top coat layer for enhancing durability may be formed on the pattern layer 412.

(2-3) Transparent Electrode Layer 421

The transparent electrode layer 421 is made of a transparent and conductive material. For example, the transparent electrode layer 421 preferably has a transmittance of light at 550 nm of 80% or higher and a sheet resistance value of 500Ω/□ or less. The transparent electrode layer 421 is formed of, for example, metal oxide, transparent conductive polymer, or transparent conductive ink. Examples of the metal oxide include indium tin oxide (ITO) and indium zinc oxide (IZO). Examples of the transparent conductive polymer include PEDOT/PSS (poly-3,4-ethylenedioxythiophene/polysulfonic acid). Examples of the transparent conductive ink include one containing carbon nanotubes or silver nanofiber in a binder. A thickness of the transparent electrode layer 421 is set in a range meeting the above-described transmittance of light and sheet resistance value.

Note that an adjustment layer for suppressing a phenomenon in which a boundary line (a contour of an electrode pattern) between a part where an electrode is formed and a part where an electrode is not formed is seen, so-called electrode-visible phenomenon, may be formed in the transparent electrode layer 421.

(2-4) Thick Film Conductive Layer 422

The thick film conductive layer 422 is formed by printing conductive ink by thick film printing. A thickness of the thick film conductive layer 422 is, for example, from 1 μm to 20 μm at a film thickness after drying. The conductive ink includes a conductive filler and a binder. As the conductive filler, for example, powder of a conductive material and conductive powder produced by plating surfaces of non-conductive particles with metal are usable. Examples of the conductive material include gold, silver, copper, aluminum, nickel, carbon, and graphite. Examples of the conductive powder plated with the metal include conductive powder produced by plating surfaces of urethane particles or silica particles with copper, nickel, or silver. Furthermore, as the binder, tackifier, which develops tackiness by heat, such as thermoplastic resin such as polyester-based resin, acrylic-based resin, vinyl chloride-vinyl acetate copolymer resin, vinyl chloride-vinyl acetate-maleic acid copolymer resin, and thermoplastic urethane resin; rosin-based resin, rosin ester-based resin, and petroleum resin can be formulated for use. Solvent used for this ink is, for example, compatible with thick film printing. Examples of the thick film printing include screen printing and gravure printing. In addition to the thermoplastic resin, for example, epoxy-based, urethane-based, or acrylic-based thermosetting resin and ultraviolet-curable resin are usable for the binder.

(2-5) Adhesive Layer 423

The adhesive layer 423 is formed of an insulating adhesive to ensure insulating properties between the patterns of the transparent electrode layer 421 and the thick film conductive layer 422. For example, thermoplastic resin is usable for the adhesive layer 423. The thermoplastic resin used for the adhesive layer 423 includes urethane-based resin, polyester-based resin, polyamide-based resin, acrylic-based resin, vinyl chloride vinyl acetate copolymer resin, and synthetic rubber. The adhesive layer 423 develops adhesiveness by heat from molten resin and improves an adhesion force of the transparent electrode layer 421, the thick film conductive layer 422, and the molded article 21. A thickness of the adhesive layer 423 is, for example, from 2 μm to 20 μm at a film thickness after drying.

(3) MANUFACTURING ELECTRICAL PRODUCT

The process of manufacturing the video camera 10 illustrated in FIG. 1 described below includes a process of electrically connecting the decorative sheet 22 and the controller 55 (an example of the electrical device) with the FPC 23. The process of connecting the FPC 23 to the decorative sheet 22 in the process is a manufacturing process of the molded product, which is a manufacturing process of the electrical product at the same time.

(3-1) Preforming Decorative Sheet 22

Figure 7A:
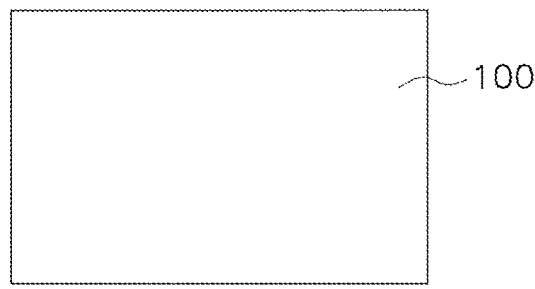
FIG. 7A is a plan view illustrating a prepared original fabric of the decorative sheet.
Figure 7B:
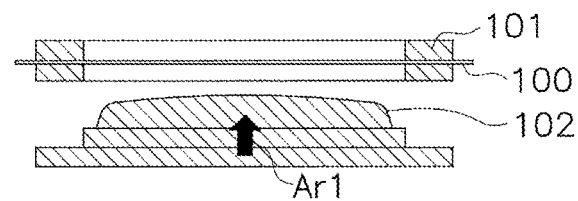
FIG. 7B is a schematic cross-sectional view illustrating the original fabric before being molded and a convex mold.
Figure 7C:
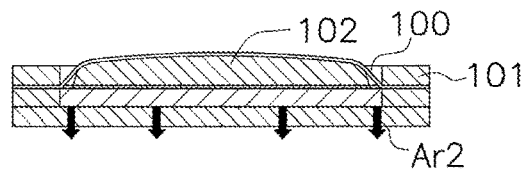
FIG. 7C is a schematic plan view of the molded original fabric.
Figure 7D:
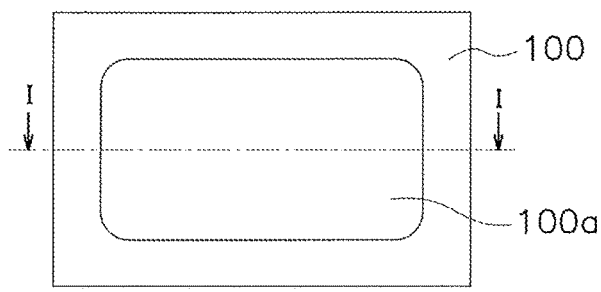
FIG. 7D is a schematic side view illustrating a cutting process of the decorative sheet from the molded original fabric.
Figure 7E:
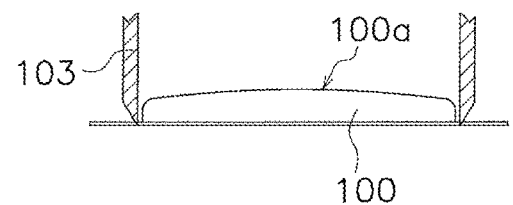
FIG. 7E is a cross-sectional view taken along I-I of FIG. 7D.

FIGS. 7A to 7E illustrate the preforming process in the manufacturing process of the molded product 20. In the process illustrated in FIG. 7A, first, an original fabric 100 of the decorative sheet 22 is prepared. The original fabric 100 is prepared, for example, in a state of being wound into a roll shape or is prepared in a sheet state. As illustrated in FIG. 7B, the original fabric 100 of the decorative sheet 22 is clamped and secured by a clamping device 101. The clamped original fabric 100 is set to, for example, a convex mold 102 of a vacuum molding apparatus or a vacuum/air-pressure molding apparatus. After setting the original fabric 100, the original fabric 100 of the decorative sheet 22 is heated, and then the convex mold 102 is moved in a direction of an arrow Ar1. The convex mold 102 is pressed against the original fabric 100 heated and reaching to a temperature at which the molding is possible, and a molded part 100a of the original fabric 100 is deformed along a surface shape of the convex mold 102. As indicated by arrows Ar2, air between the convex mold 102 and the original fabric 100 is removed. The original fabric 100 cooled and removed after the molding with the convex mold 102 is illustrated in FIG. 7D. The decorative sheet 22 is cut out from the original fabric 100 with a cutter 103 illustrated in FIG. 7E to obtain the preformed decorative sheet 22.

(3-2) Connecting FPC 23 to Decorative Sheet 22

Figure 8A:
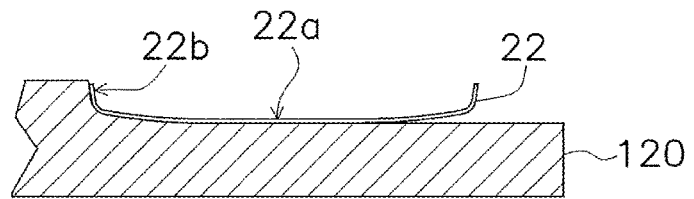
FIG. 8A is a schematic cross-sectional view of the decorative sheet set on a pedestal.

FIGS. 8A to 8F illustrate a process of connecting the FPC 23 to the thick film conductive layer 422 in the decorative sheet 22. First, as illustrated in FIG. 8A, the preformed decorative sheet 22 is placed on a pedestal 120 to be positioned. Excluding a part to which the FPC 23 is connected and its periphery, the pedestal 120 has a shape substantially identical to the cross-sectional shape of the molded part 100a taken along line I-I of FIG. 7D.

Figure 8B:
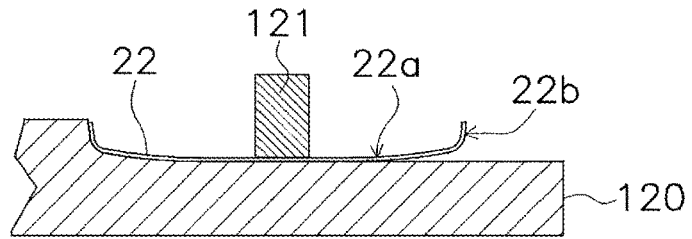
FIG. 8B is a schematic cross-sectional view for describing fixation of the decorative sheet to the pedestal using securing jigs.
Figure 8C:
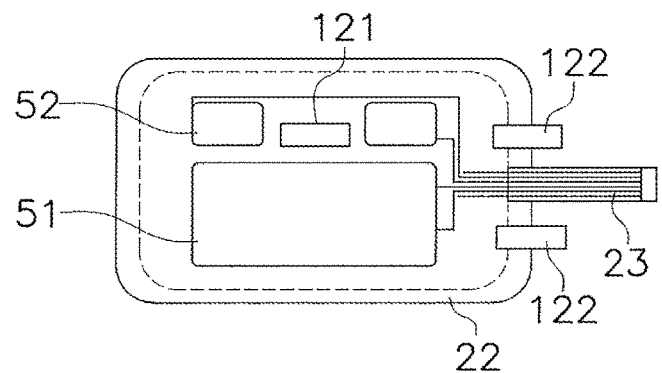
FIG. 8C is a schematic plan view for describing fixation of the decorative sheet to the pedestal using the securing jigs.

The decorative sheet 22 placed on the pedestal 120 is fixed by being pressed against the pedestal 120 with securing jigs 121 and 122 illustrated in FIGS. 8B and 8C. For example, an anisotropic conductive adhesive 241 and the FPC 23 are disposed overlapped on the connecting pattern 427 of the fixed decorative sheet 22. The preformed decorative sheet 22 has a peripheral edge portion 22b standing up from a base portion 22a so as to correspond to the standing wall 32 of the molded article 21. The securing jigs 122 press and flatten the peripheral edge portion 22b. As a result, even when a heating/pressurizing jig 123 described later applies heat and pressure to the peripheral edge portion 22b, the peripheral edge portion 22b easily maintains the shape after being preformed.

Figure 8D:
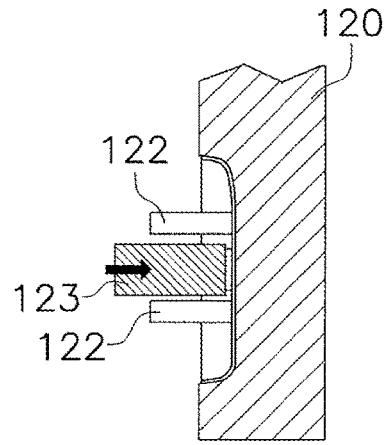
FIG. 8D is a schematic cross-sectional view for describing attachment of an FPC to the decorative sheet.
Figure 8E:
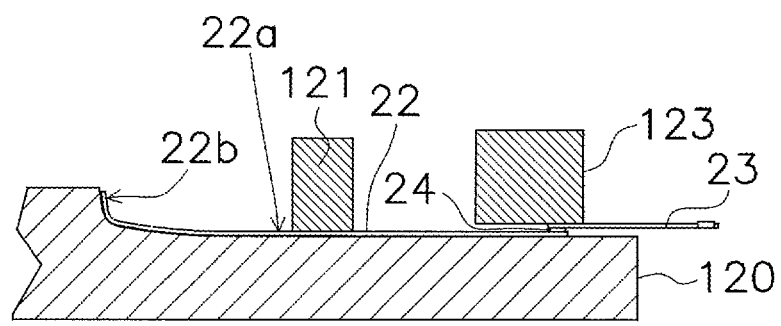
FIG. 8E is a schematic cross-sectional view for describing the attachment of the FPC to the decorative sheet.
Figure 8F:
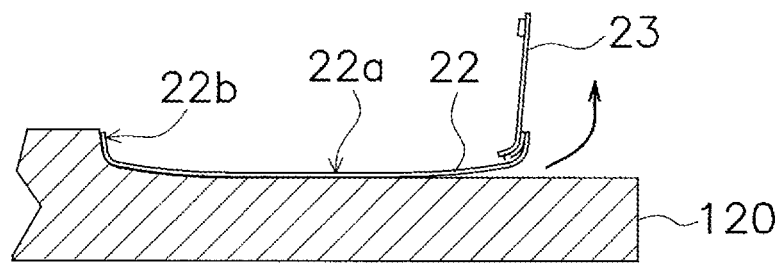
FIG. 8F is a schematic cross-sectional view of the decorative sheet to which the FPC is attached.

The heat and pressure are applied to a part where the decorative sheet 22, the anisotropic conductive adhesive 241, and the FPC 23 overlap with the heating/pressurizing jig 123 such that the decorative sheet 22 and the FPC 23 are adhered with the anisotropic conductive adhesive 241. FIGS. 8D and 8E schematically illustrate cross-sectional shapes where the decorative sheet 22 is cut at different locations when the heat and pressure are applied with the heating/pressurizing jig 123. Here, a temperature that the decorative sheet 22 reaches by the heating/pressurizing jig 123 is a temperature at which the shape of the preformed decorative sheet 22 is maintained. To do so, it is only necessary to hold a predetermined pressure for a certain period of time at a temperature at which the binder of the anisotropic conductive adhesive softens and develops an adhesive force by the heating/pressurizing jig 123, and it is only necessary to hold the pressure of, for example, 1 to 4 MPa at 100° C. to 140° C. for two to ten seconds. In the pressure bonding conditions, the base film 411 in the decorative sheet 22 recovers the preformed shape or a shape close to the preformed shape without being thermally deformed.

Note that the decorative sheet 22, the FPC 23, and the anisotropic conductive film 24 are adhered by heat and pressure given from the molten resin that will later become the molded article 21 during the injection molding of the molded article 21.

(3-3) Manufacturing Molded Product 20

Figure 9:
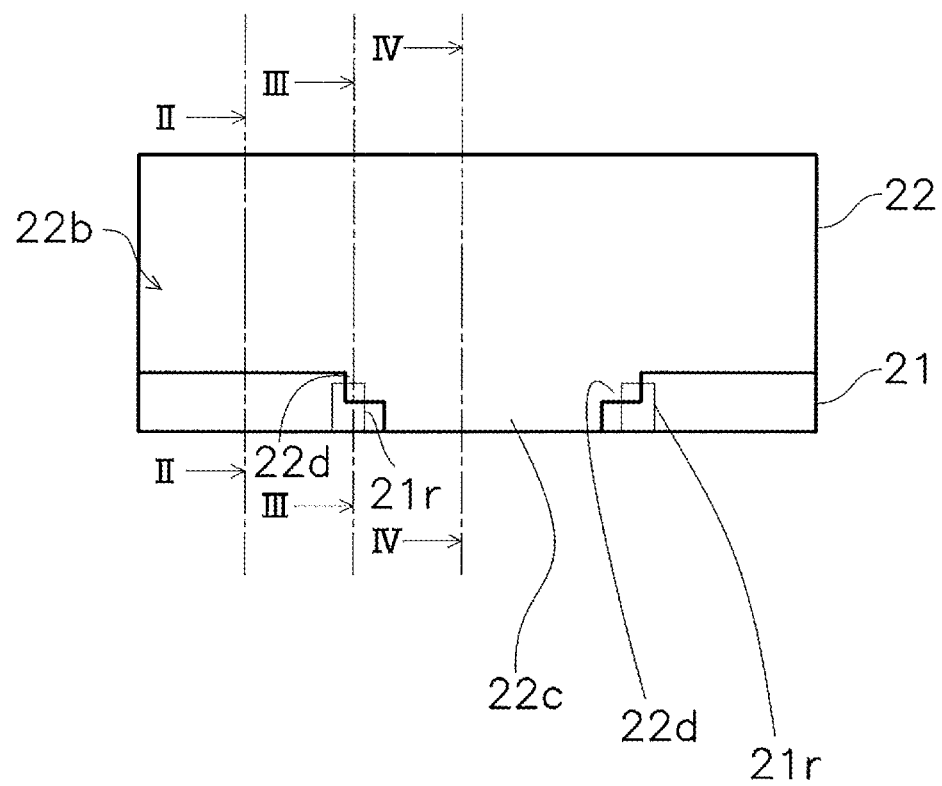
FIG. 9 is a partially enlarged side view where a part of a side surface of the molded product is enlarged.
Figure 10:
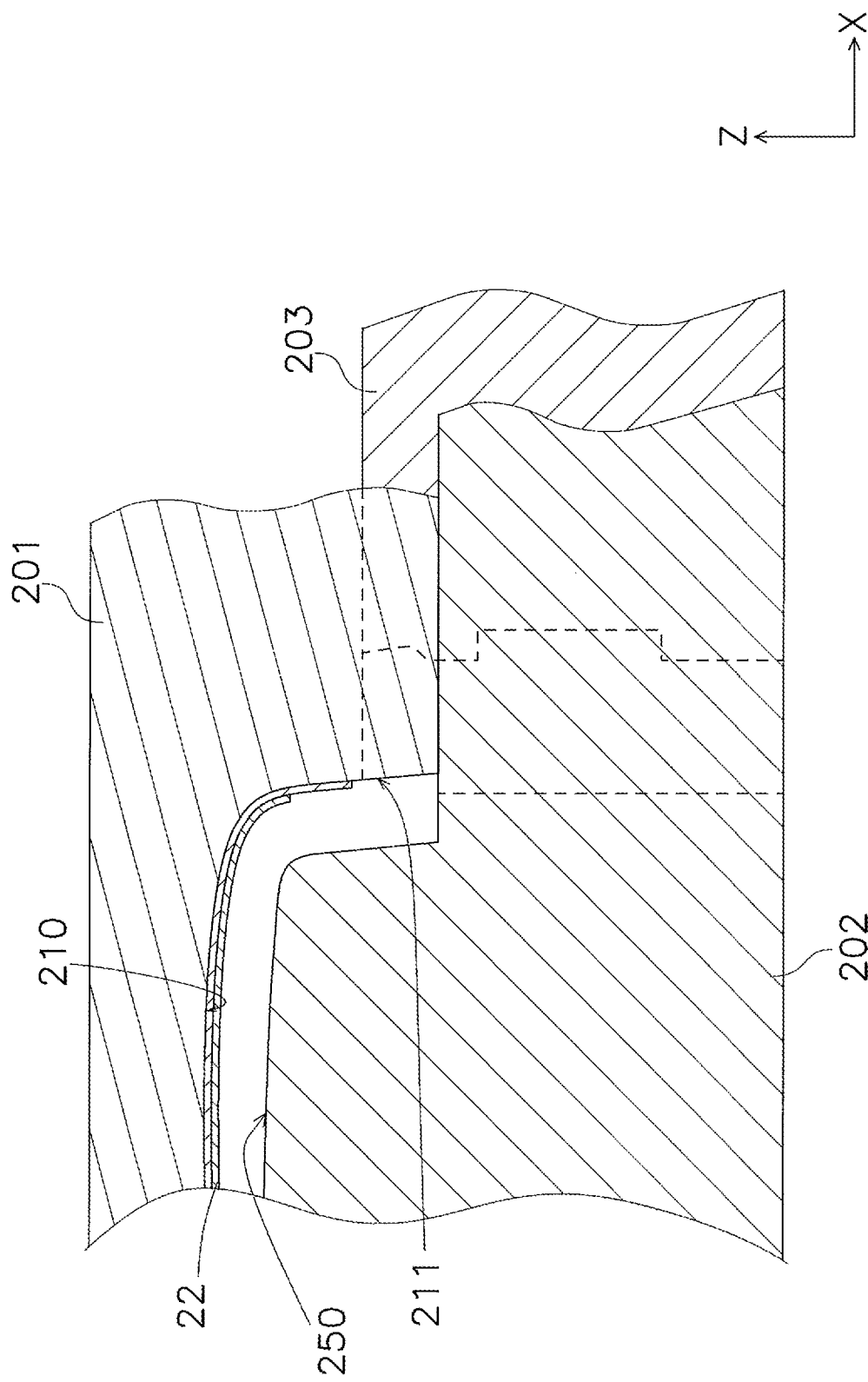
FIG. 10 is a partially enlarged cross-sectional view enlarging clamped first mold to third mold corresponding to line II-II of FIG. 9.
Figure 11:
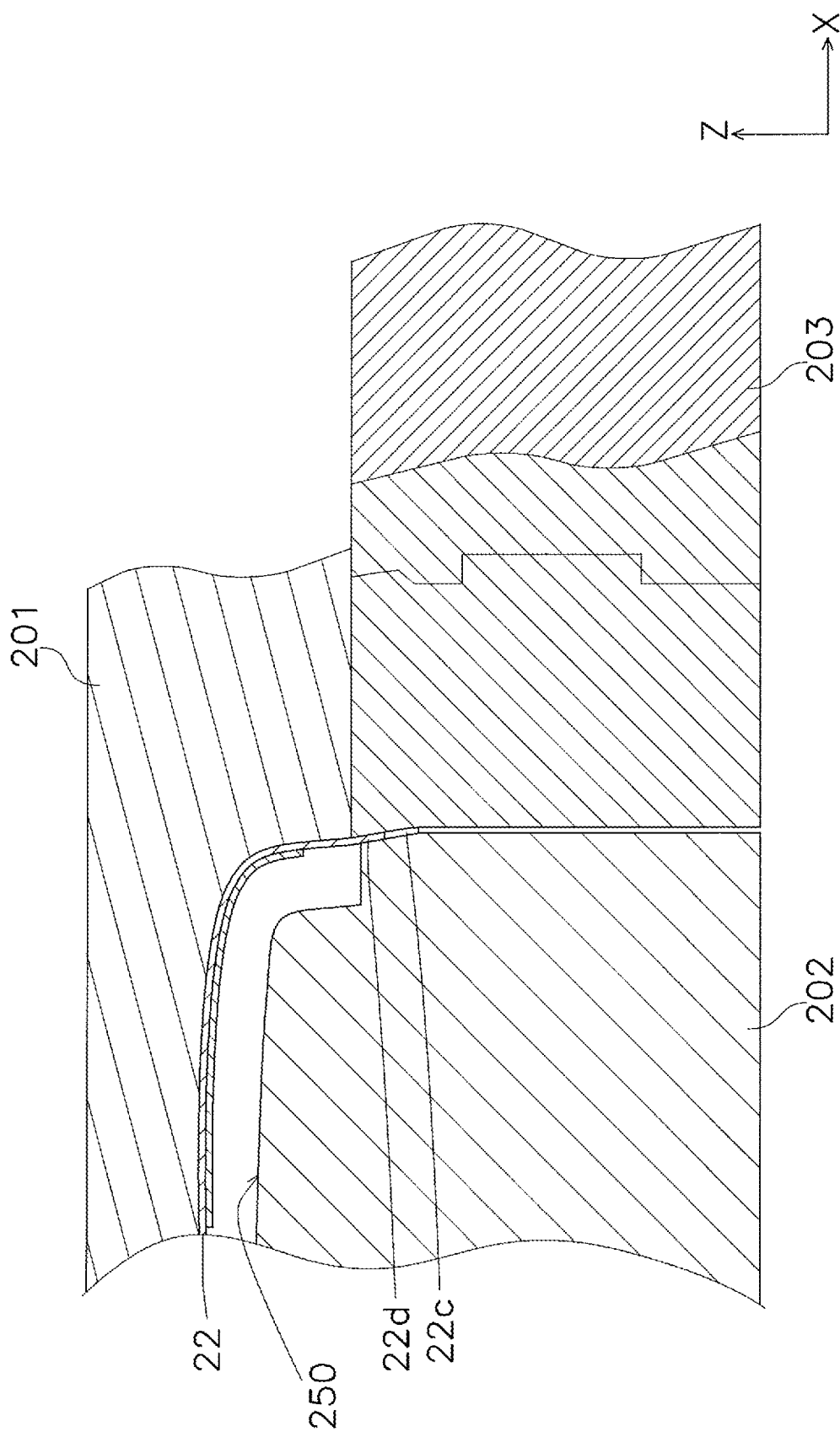
FIG. 11 is a partially enlarged cross-sectional view enlarging the clamped first mold to third mold corresponding to line III-III of FIG. 9.
Figure 12:
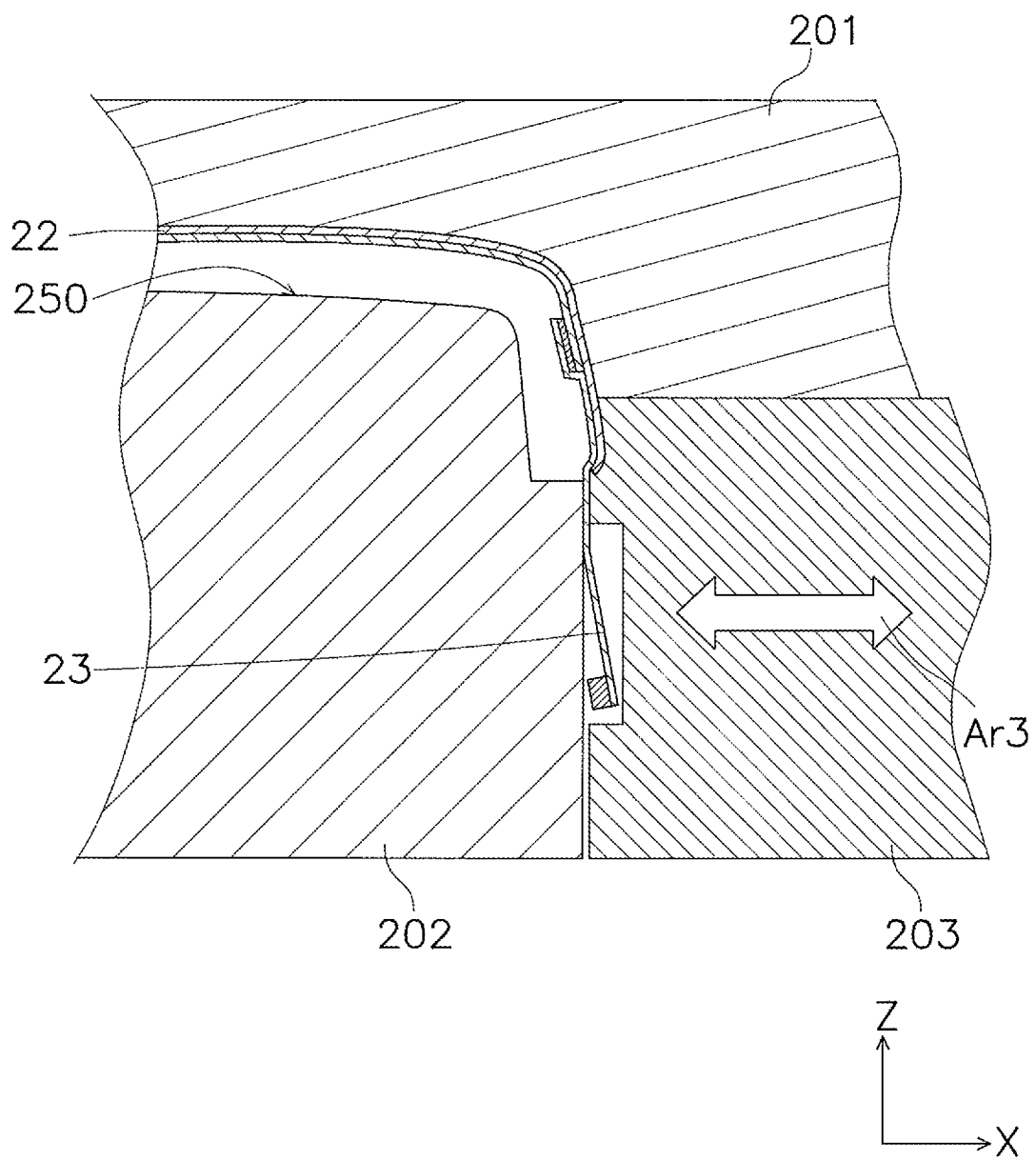
FIG. 12 is a partially enlarged cross-sectional view enlarging the clamped first mold to third mold corresponding to line IV-IV of FIG. 9.

The following describes one example of the method for manufacturing the molded product 20 with reference to FIGS. 9 to 13. Shown enlarged, FIG. 9 illustrates an appearance shape around the peripheral edge portion 22b and an extension portion 22c where the connecting pattern 427 of the decorative sheet 22 of the molded product 20 is formed. In the decorative sheet 22, an expansion portion 22d that expands a width of the extension portion 22c is formed in the vicinity of a boundary between the peripheral edge portion 22b and the extension portion 22c. FIG. 10 illustrates a cross-section of a first mold 201 and a second mold 202 corresponding to a cross-section of the molded product 20 taken along line II-II of FIG. 9. FIG. 11 illustrates a cross-section of the first mold 201, the second mold 202, and a third mold 203 corresponding to the cross-section of the molded product 20 taken along line III-III of FIG. 9. Additionally, FIG. 12 illustrates a cross-section of the first mold 201, the second mold 202, and the third mold 203 corresponding to the cross-section of the molded product 20 taken along line IV-IV of FIG. 9.

The preformed decorative sheet 22 is set in a recess portion 210 of the first mold 201. Since the shape of the preformed decorative sheet 22 substantially matches the shape of the recess portion 210, the decorative sheet 22 can be set in the recess portion 210 without an application of stress to the decorative sheet 22 for deformation. To motionlessly set the decorative sheet 22 in the recess portion 210, for example, a suction mechanism only needs to be provided in the first mold 201 to suction the decorative sheet 22. The first mold 201 and the second mold 202 are clamped to form a first cavity 250 corresponding to the shape of the molded product 20. The third mold 203 illustrated in FIG. 10 has not been closed yet.

The third mold 203 indicated by the broken lines in FIG. 11 is in an open state that has not been closed yet and the third mold 203 indicated by the solid line in FIG. 11 is in the closed state. In the state where the molds are clamped and the third mold 203 is closed as indicated by the solid line, the expansion portion 22d of the decorative sheet 22 is sandwiched between the second mold 202 and the third mold 203. When the expansion portion 22d is sandwiched between the second mold 202 and the third mold 203 in this manner, a so-called resin bleed phenomenon where the molten resin injected into the first cavity 250 enters between the first mold 201 and the decorative sheet 22 can be suppressed.

FIG. 12 illustrates the third mold 203 in the closed state. As indicated by an arrow Ar3 illustrated in FIG. 12, the third mold 203 is configured to be slidable parallel to parting lines of the first mold 201 and second mold 202. With the first mold 201 and the second mold 202 clamped and the third mold 203 open, an opening that causes the FPC 23 as the external connecting portion to protrude to an external space outside the first cavity 250 is open. The FPC 23 can protrude to the external space through this opening. By closing the third mold 203 after a part of the FPC 23 protrudes to the external space in this manner, the FPC 23 can be sandwiched between the second mold 202 and the third mold 203 as illustrated in FIG. 12.

Figure 13:
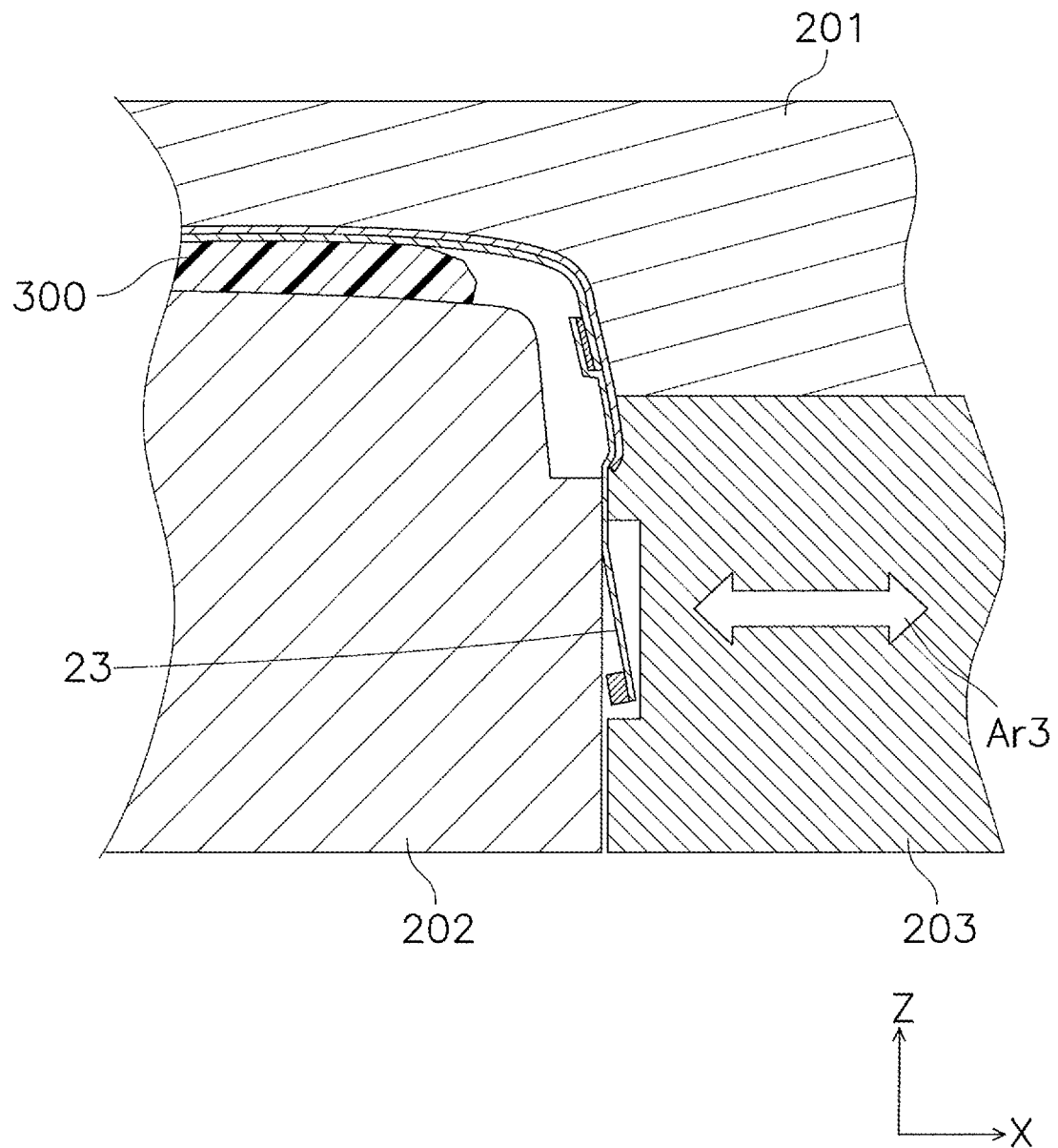
FIG. 13 is a partially enlarged cross-sectional view illustrating a state in which molten resin is injected into a first cavity.

While maintaining the state illustrated in FIG. 12, as illustrated in FIG. 13, molten resin 300 is injected into the first cavity 250 to form the molded article 21. At this time, the adhesive layer 423 of the decorative sheet 22 is activated by the heat from the molten resin 300. When the molten resin 300 cools and hardens, the molded article 21, which is formed by hardening the molten resin 300, and the decorative sheet 22 are adhered. In addition, the temperature and the pressure higher than the usually set pressure bonding conditions are applied to the anisotropic conductive film 24 by the heat and the pressure from the molten resin 300; therefore, the anisotropic conductive film 24 exhibits superior conductivity and adhesive force. For example, the temperature of the molten resin 300 is 180° C. or higher.

Next, the first mold 201, the second mold 202, and the third mold 203 are opened. The molded product 20 is unset from the second mold 202, for example, with an ejector pin (not illustrated) projecting from the second mold 202 and held and removed by a removal robot (not illustrated) that has entered.

Note that rectangular regions indicated by reference numeral 21r in FIG. 9 are parts sandwiched between the second mold 202 and the third mold 203.

(4) MOLDED ARTICLE

The molded article 21 may be colored or uncolored and is molded using a transparent, translucent, or opaque thermoplastic resin or elastomer. As a material of the molded article 21, general-purpose thermoplastic resin such as polystyrene-based resin, polyolefin-based resin, acrylonitrile butadiene styrene (ABS) resin, or acrylonitrile-styrene (AS) resin is preferably used. Except for these resins, as the material of the molded article 21, polycarbonate-based resin, polyacetal resin, acrylic-based resin, polybutylene terephthalate resin, engineering resin (polysulfone resin, polyphenylene sulfide-based resin, polyphenylene oxide-based resin, polyarylate-based resin, and the like), polyamide-based resin, or urethane-based, polyester-based, or styrene-based elastomer are usable. Furthermore, natural rubber or synthetic rubber is usable as the material of the molded article 21. A reinforcing material such as glass fiber or inorganic filler can also be added to the molded article 21.

(5) MODIFIED EXAMPLES (5-1) Modified Example 1A

While the method for manufacturing the molded product 20 of the first embodiment has described the case where the third mold 203 moves parallel (the direction along the X-axis) to the parting lines of the first mold 201 and the second mold 202, the movement direction of the third mold 203, in other words, the method that the FPC 23 is sandwiched between the second mold 202 and the third mold 203 is not limited to the movement direction of the first embodiment and the method for sandwiching of the FPC 23.

Figure 14:
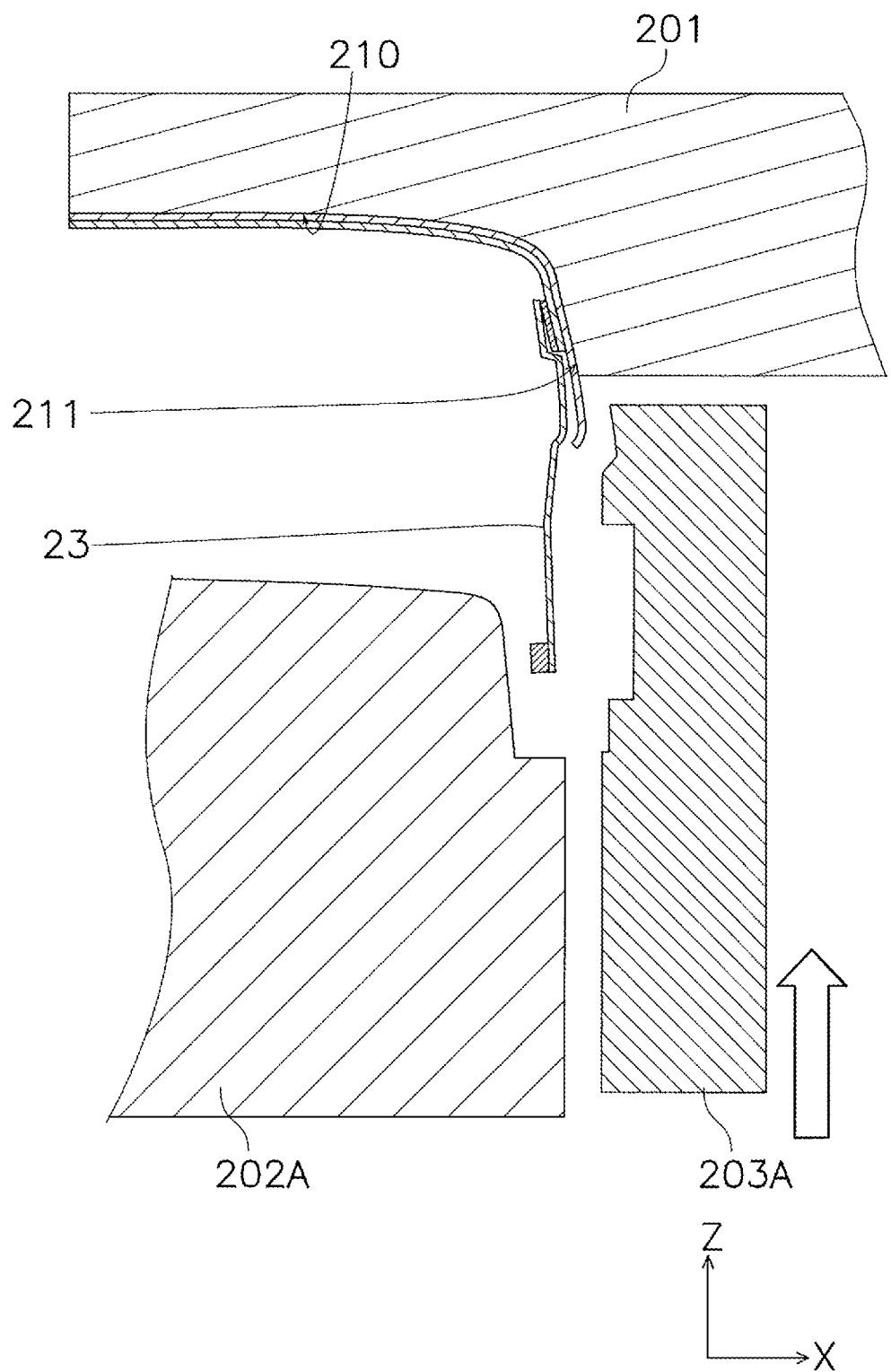
FIG. 14 is a partially enlarged cross-sectional view illustrating other first mold to third mold before clamping.
Figure 15:
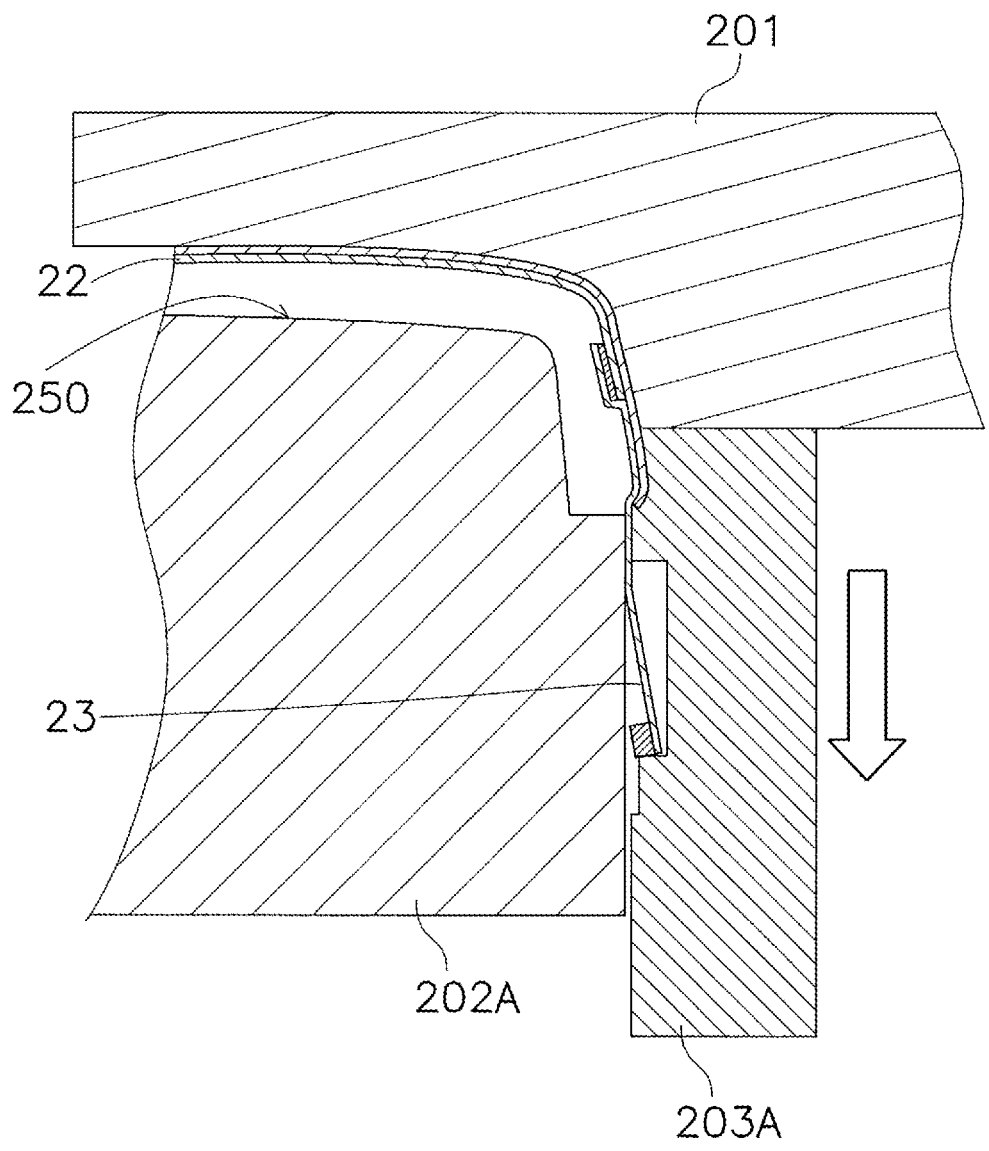
FIG. 15 is a partially enlarged cross-sectional view illustrating the other clamped first mold to third mold.

For example, as illustrated in FIGS. 14 and 15, a third mold 203A may be configured to move in a vertical direction (a direction along a Z-axis) with respect to parting lines of the first mold 201 and a second mold 202A. Even in the configuration using the molds different from those of the first embodiment, the FPC 23 can be sandwiched between the second mold 202A and the third mold 203A.

(5-2) Modified Example 1B

While the first embodiment has described the case where the touch sensor 51 and the membrane switches 52 are configured using the conductive circuit layer 42, only any one of the touch sensors 51 and the membrane switches 52 may be configured using the conductive circuit layer 42. Another function, for example, an electroluminescence (EL) display or the like may be configured using the conductive circuit layer 42, and the configuration is not limited to the example of the first embodiment.

(5-3) Modified Example 1C

In the molded product 20 of the first embodiment, the location where the FPC 23 and the decorative sheet 22 are electrically connected, that is, the location where the anisotropic conductive film 24 is formed is on the wall front surface 32a of the standing wall 32 in the first embodiment. However, the location where the FPC 23 and the decorative sheet 22 are electrically connected may be on the boundary between the main body 31 and the standing wall 32 of the molded article 21, or may be on the main body 31.

Second Embodiment (6) OTHER CONFIGURATIONS OF MOLDED PRODUCT

Figure 16:
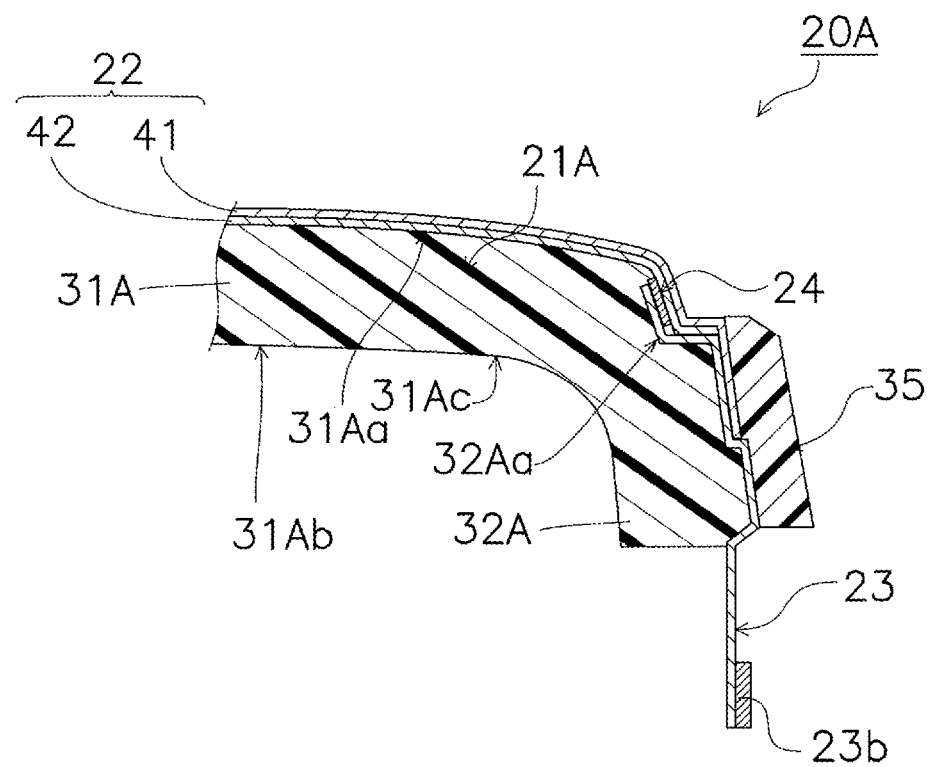
FIG. 16 is a partial cross-sectional view of a molded product according to a second embodiment.
Figure 17:
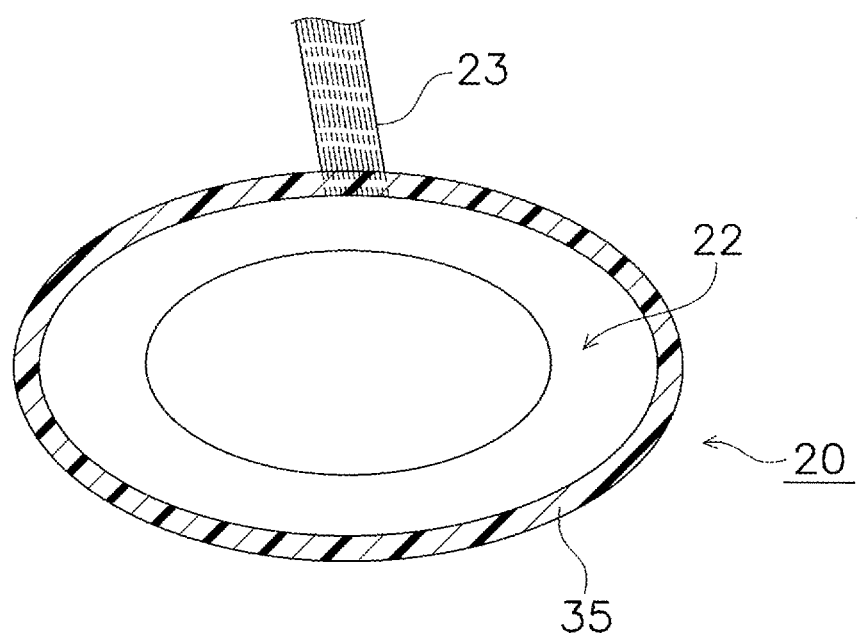
FIG. 17 is a schematic plan view of the molded product according to the second embodiment.
Figure 18:
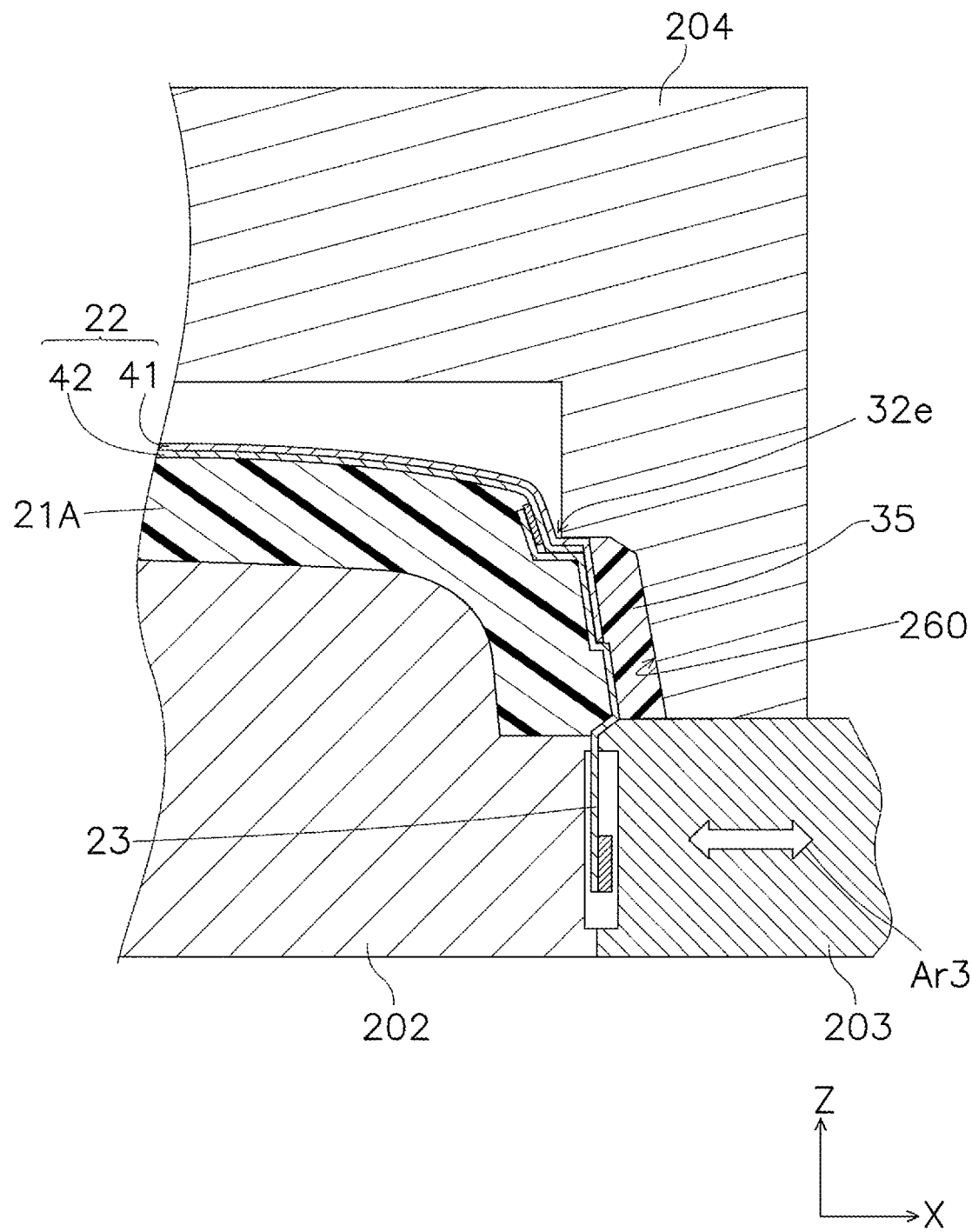
FIG. 18 is a partially enlarged cross-sectional view of clamped second mold to fourth mold.

Next, the following describes a molded product according to a second embodiment of the present disclosure with reference to FIGS. 16 to 18. A point that a molded product 20A according to the second embodiment differs from the molded product 20 of the first embodiment is that a fixing portion 35 illustrated in FIGS. 16 and 17 is formed. This molded product 20A of the second embodiment also includes a standing wall 32A made of resin that integrally stands up from an end portion 31Ac of a main body 31A. This standing wall 32A extends to bend in a direction from a main body front surface 31Aa to a main body back surface 31Ab of the main body 31A. An electrical connecting part of the FPC 23 with the conductive circuit layer 42 is laminated on a wall front surface 32Aa. This fixing portion 35 annularly covers a part of the FPC 23 together with the molded article 21 in the standing wall 32A. As described with reference to FIG. 9, the extension portion 22c overlaps with the FPC 23; therefore, it can be regarded that the fixing portion 35 covers the extension portion 22c. Thus, although the entire extension portion 22c may be covered, in the case of the long extension portion 22c, it is only necessary to cover a part of the extension portion 22c. For example, compared with the molded product 20, with the presence of this fixing portion 35, stress is less likely to be applied from outside the molded product 20A to the FPC 23. Additionally, even when stress is applied from the outside to the FPC 23, the FPC 23 and/or the decorative sheet 22 is less likely to be damaged compared with the molded product 20.

The fixing portion 35 illustrated in FIGS. 16 and 17 covers not only the boundary part between the FPC 23 and the decorative sheet 22, but also the whole circumference of the end portion of the decorative sheet 22.

(6-1) Method for Manufacturing Molded Product 20A

The manufacturing process up to before the fixing portion 35 is formed can be configured similarly to the manufacturing process of the molded product 20 described in the first embodiment up to a molded article 21A is formed using the first mold 201, the second mold 202, and the third mold 203. However, to facilitate the formation of the fixing portion 35, a step 32e is formed on the standing wall 32 in the molded article 21A.

After the molded article 21A is formed using the first mold 201, the second mold 202, and the third mold 203 and the molded article 21A is cooled, in a state where only the first mold 201 is removed and the molded article 21A remains, a fourth mold 204 is clamped with the second mold 202 and the third mold 203 (see FIG. 18).

In the state where the molded article 21A remains, clamping the fourth mold 204 with the second mold 202 and the third mold 203 forms a second cavity 260 surrounded by the third mold 203, the fourth mold 204, and the molded article 21A. Molten resin is injected into this second cavity 260 to form the fixing portion 35.

(7) MODIFIED EXAMPLE

(7-1) Modified Example 2A

Figure 19:
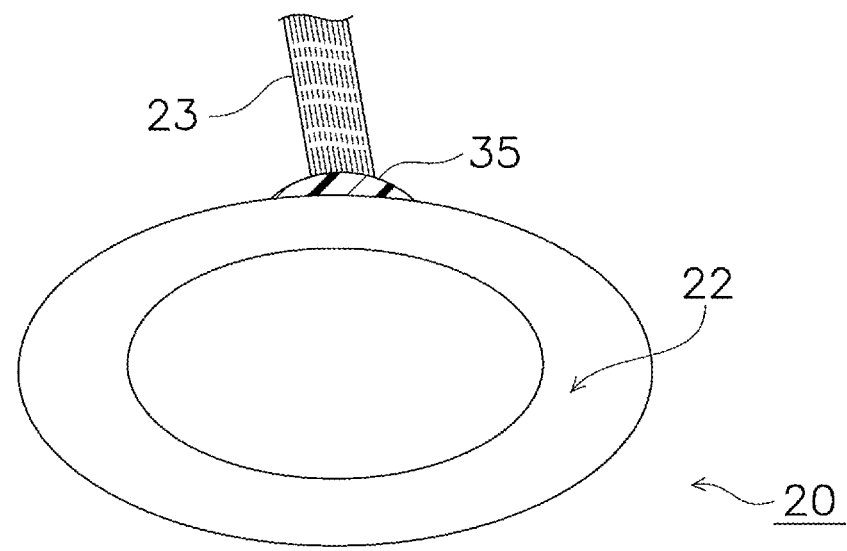
FIG. 19 is a schematic plan view of a molded product according to a modified example 2A.

While the second embodiment has described the case where the fixing portion 35 covers the whole circumference of the end portion of the decorative sheet 22, the fixing portion 35 needs not to cover the whole circumference of the decorative sheet 22, and may be configured to cover only a part of the end portion of the decorative sheet 22 as illustrated in FIG. 19.

Third Embodiment

(8) OTHER CONFIGURATIONS OF MOLDED PRODUCT

In the first embodiment and the second embodiment, the preformed decorative sheet 22 is integrated with the molded article 21 while maintaining the preformed shape, thus integrating the FPC 23 with the molded article 21 between the wall front surface 32a of the standing wall 32 of the molded article 21 and the decorative sheet 22. The following describes another manufacturing method according to a third embodiment that integrates the FPC 23 with the molded article 21 between the wall front surface 32a of the standing wall 32 and the decorative sheet 22 with reference to FIGS. 20A, 20B, 20C, 20D, and 21. A molded product 20B of this third embodiment also includes a standing wall 32B made of resin that integrally stands up from an end portion 31Bc of a main body 31B. This standing wall 32B extends to bend in a direction from a main body front surface 31Ba to a main body back surface 31Bb of the main body 31B.

Figure 20A:
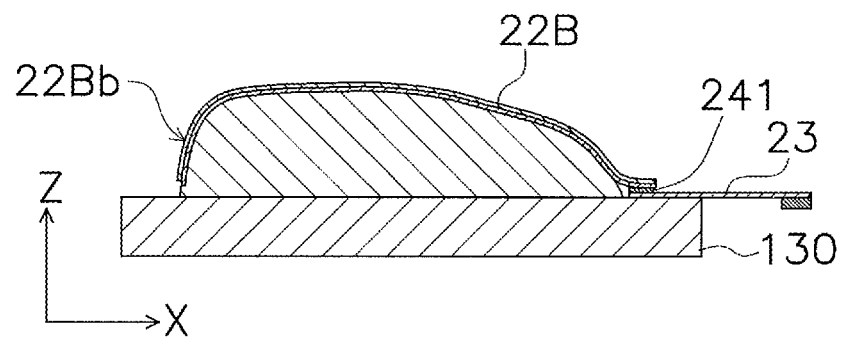
FIG. 20A is a schematic cross-sectional view for describing attachment of the FPC to a decorative sheet according to a third embodiment.
Figure 20B:
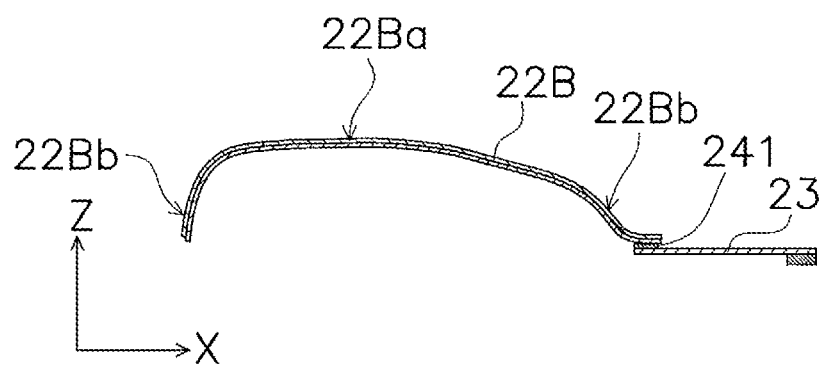
FIG. 20B is a schematic cross-sectional view of the decorative sheet to which the FPC is attached.
Figure 20C:
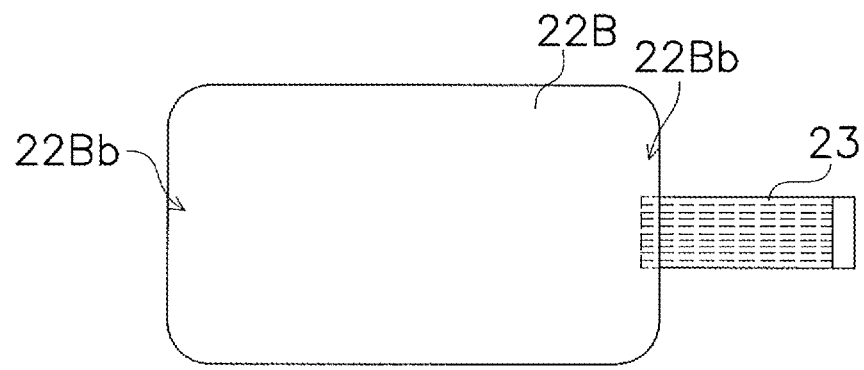
FIG. 20C is a schematic plan view of the decorative sheet to which the FPC is attached.
Figure 20D:
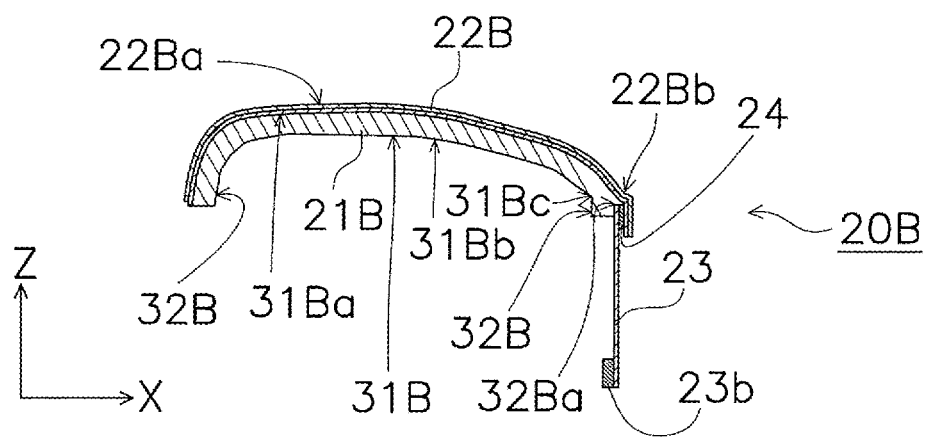
FIG. 20D is a cross-sectional view of the molded product according to the second embodiment.

As illustrated in FIG. 20A, a location where the FPC 23 is attached in a peripheral edge portion 22Bb of a decorative sheet 22B fixed to a pedestal 130 is not preformed. Therefore, the decorative sheet 22B and the FPC 23 can be adhered with the anisotropic conductive adhesive 241 in the flat state without being suppressed with a jig. However, after the adhesion of the FPC 23, as illustrated in FIGS. 20B and 20C, the location to which the FPC 23 is adhered is not preformed. In other words, the location to which the FPC 23 and the anisotropic conductive adhesive 241 are adhered extends along an extending direction of a base portion 22Ba of the decorative sheet 22B.

Figure 21:
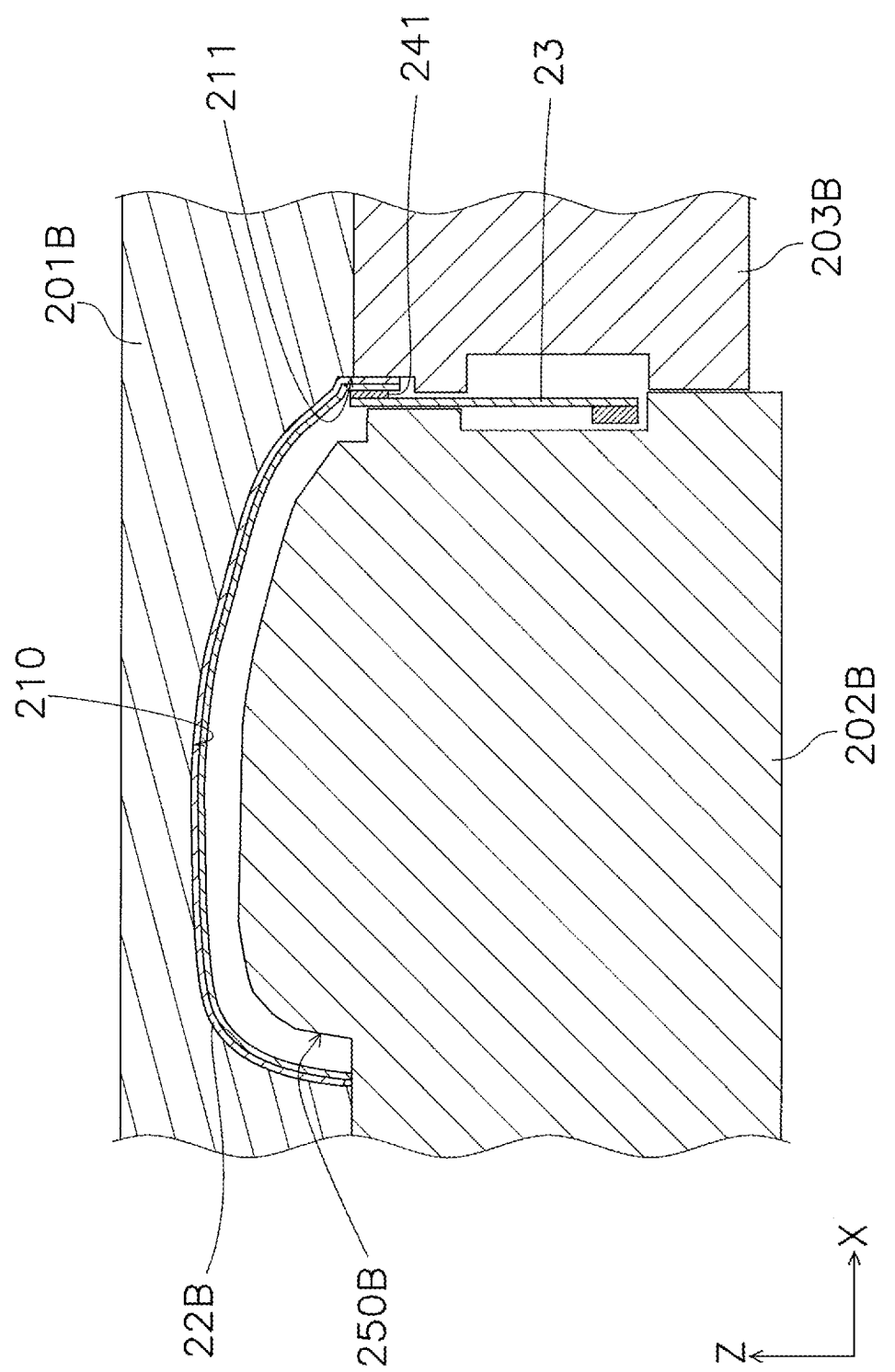
FIG. 21 is a partially enlarged cross-sectional view of clamped first mold to third mold.

To form a standing wall at which the FPC 23 is adhered, as illustrated in FIG. 21, while a distal end part of the peripheral edge portion 22Bb is bent along the Z-axis direction with a first mold 201B, a second mold 202B, and a third mold 203B, the molten resin is injected into a first cavity 250B. To bend the peripheral edge portion 22Bb in this way, the laminated part of the decorative sheet 22B, the anisotropic conductive adhesive 241, and the FPC 23 is sandwiched between the second mold 202B and the third mold 203B. In this case as well, the decorative sheet 22B and the FPC 23 can be adhered by the heat and pressure given from the molten resin and the second mold 202B and the third mold 203B. In this manner, a molded article 21B (see FIG. 20D) can be formed with the peripheral edge portion 22Bb of the decorative sheet 22 bent. Thus, in the molded product 20B of the third embodiment as well, the FPC 23 can be disposed along the standing wall 32B, which extends in a direction (here, approximately the Z-axis direction) intersecting with the main body 31B of the molded article 21B extending approximately in the X-axis direction. The electrical connecting part of the FPC 23 with the conductive circuit layer 42 is laminated on a wall front surface 32Ba.

(9) Modified Examples

(9-1) Modified Example 3A

Figure 22A:
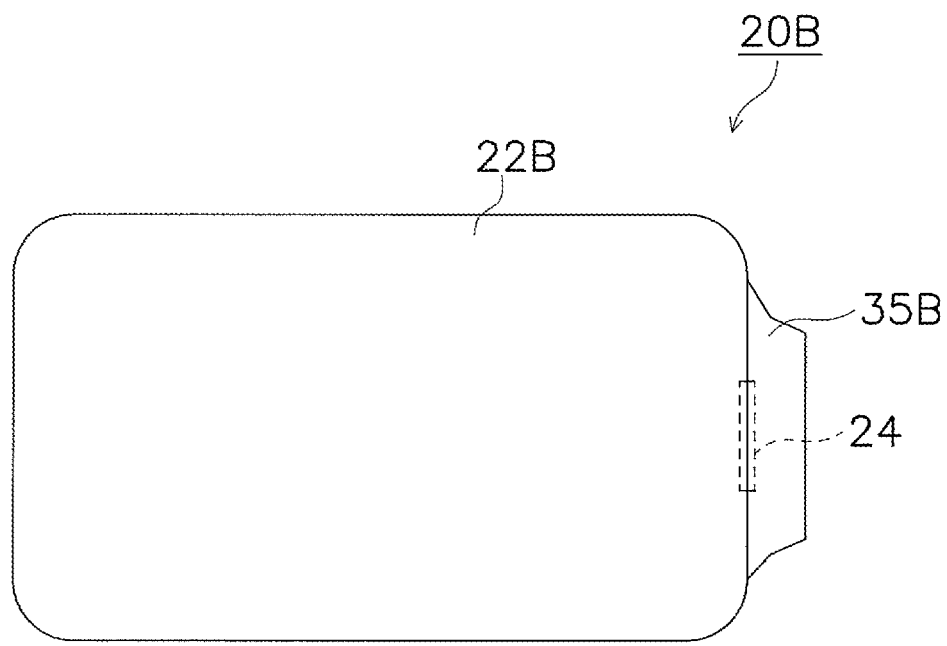
FIG. 22A is a schematic plan view of a molded product according to a modified example 3A.
Figure 22B:
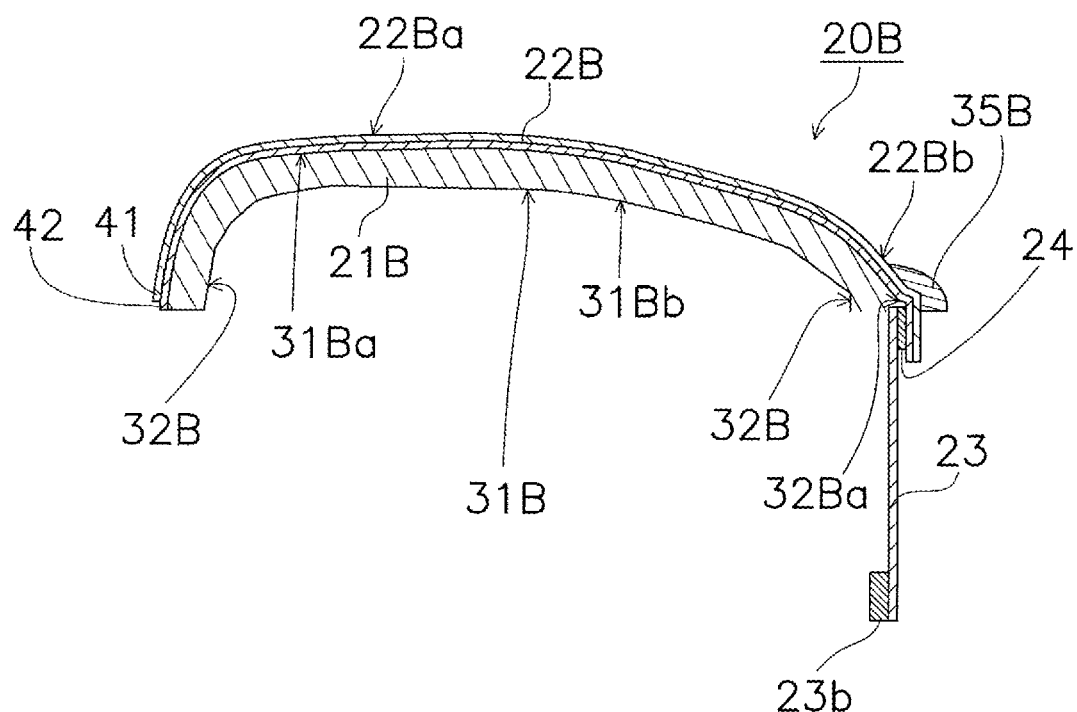
FIG. 22B is a schematic plan view of the molded product according to the modified example 3A.

The molded product 20B of the third embodiment can also form a fixing portion 35B (see FIGS. 22A and 22B) having the function identical to the fixing portion 35 described in the second embodiment. In addition, similarly to the second embodiment, the fixing portion 35B can be molded by forming the molded article 21B using the first mold 201B, the second mold 202B, and the third mold 203B, and then opening the first mold 201B and further performing injection using the second mold 202B, the third mold 203B, and a fourth mold 204B.

Figure 24:
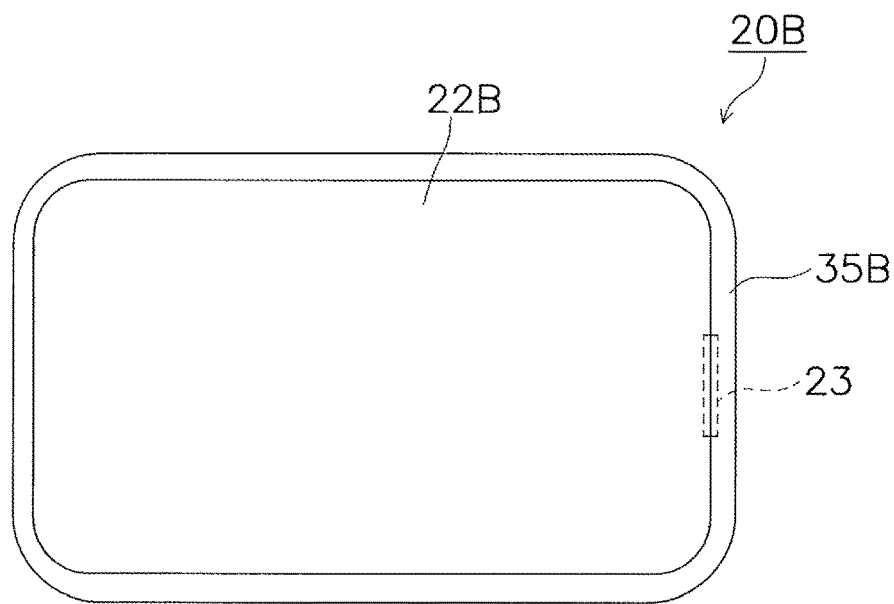
FIG. 24 is a schematic plan view of a molded product according to another example of the modified example 3A.

Note that as illustrated in FIG. 24, the fixing portion 35B may be formed so as to cover the whole circumference of the decorative sheet 22B.

(9-2) Modified Example 3B

Figure 25A:
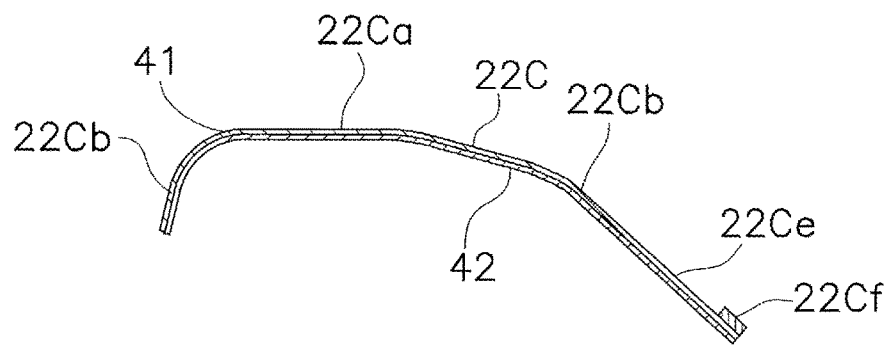
FIG. 25A is a schematic cross-sectional view of a preformed decorative sheet according to a modified example 3B.
Figure 25B:
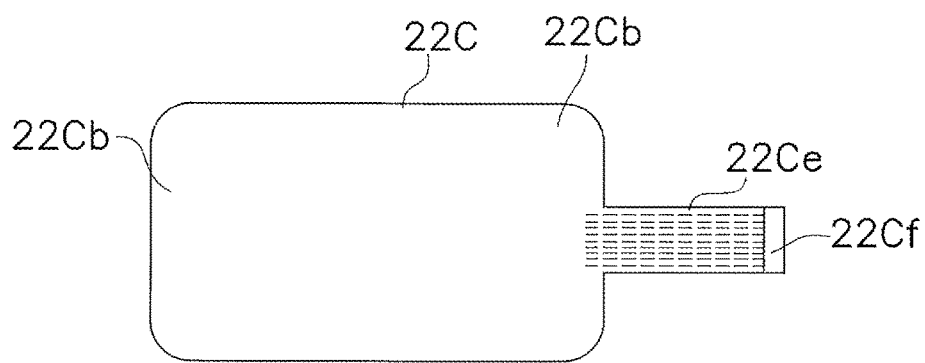
FIG. 25B is a schematic plan view of the decorative sheet of FIG. 25A.
Figure 25C:
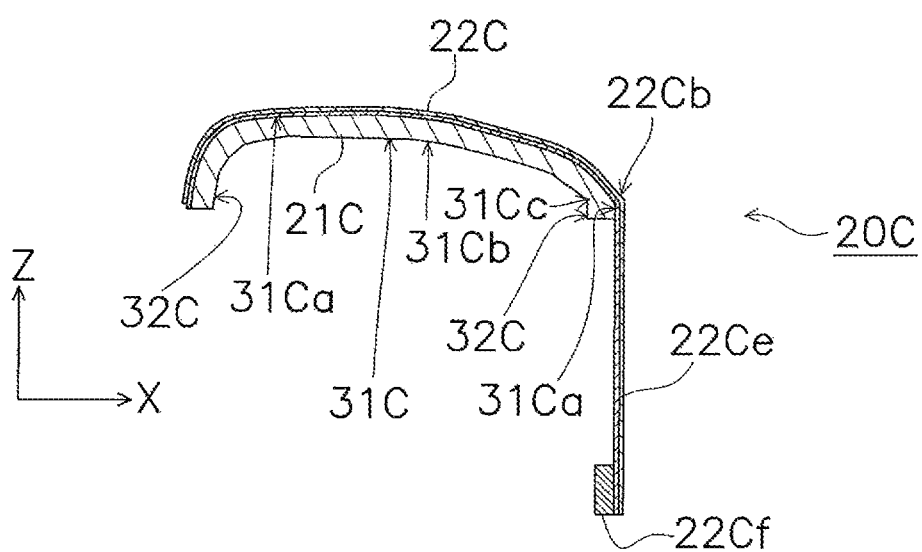
FIG. 25C is an enlarged cross-sectional view of a molded product according to the modified example 3B.

According to the manufacturing method for the third embodiment, similarly to one where the external connecting portion is formed using the conductive circuit layer of the decorative sheet, not the FPC 23, as illustrated in FIGS. 25A, 25B, and 25C, in a molded product 20C of a modified example 3B as well, a lead portion 22Ce can be disposed along a standing wall 32C, which extends in a direction (here, approximately the Z-axis direction) intersecting with a main body 31C of a molded article 21C extending approximately in the X-axis direction. A reinforcing member 22Cf is disposed on an end portion of the lead portion 22Ce connected to outside. The molded product 20C of this modified example 3B also includes the standing wall 32C made of resin that integrally stands up from an end portion 31Cc of the main body 31C. This standing wall 32C extends to bend in a direction from a main body front surface 31Ca to a main body back surface 31Cb of the main body 31C.

Because the lead portion 22Ce is formed using the conductive circuit layer 42, the process of attaching the FPC 23 to a peripheral edge portion 22Cb of a decorative sheet 22C using the pedestal 130 illustrated in FIG. 20A is omitted. However, since it is preferable not to bend the lead portion 22Ce, as illustrated in FIG. 25A, the periphery of the lead portion 22Ce is not preformed. Note that the lead portion 22Ce may be preformed so as to extend along an extending direction of a base portion 22Ca.

As described with reference to FIG. 21, to dispose the lead portion 22Ce on the standing wall, while the distal end part of the peripheral edge portion 22Bb is bent along the Z-axis direction with the first mold 201B, the second mold 202B, and the third mold 203B, the molten resin is injected into the first cavity 250B. In this manner, the lead portion 22Ce is sandwiched between the second mold 202B and the third mold 203B to bend the peripheral edge portion 22Bb. Thus, the molded article 21C (see FIG. 25C) can be formed with the peripheral edge portion 22Bb of the decorative sheet 22 bent.

Figure 23:
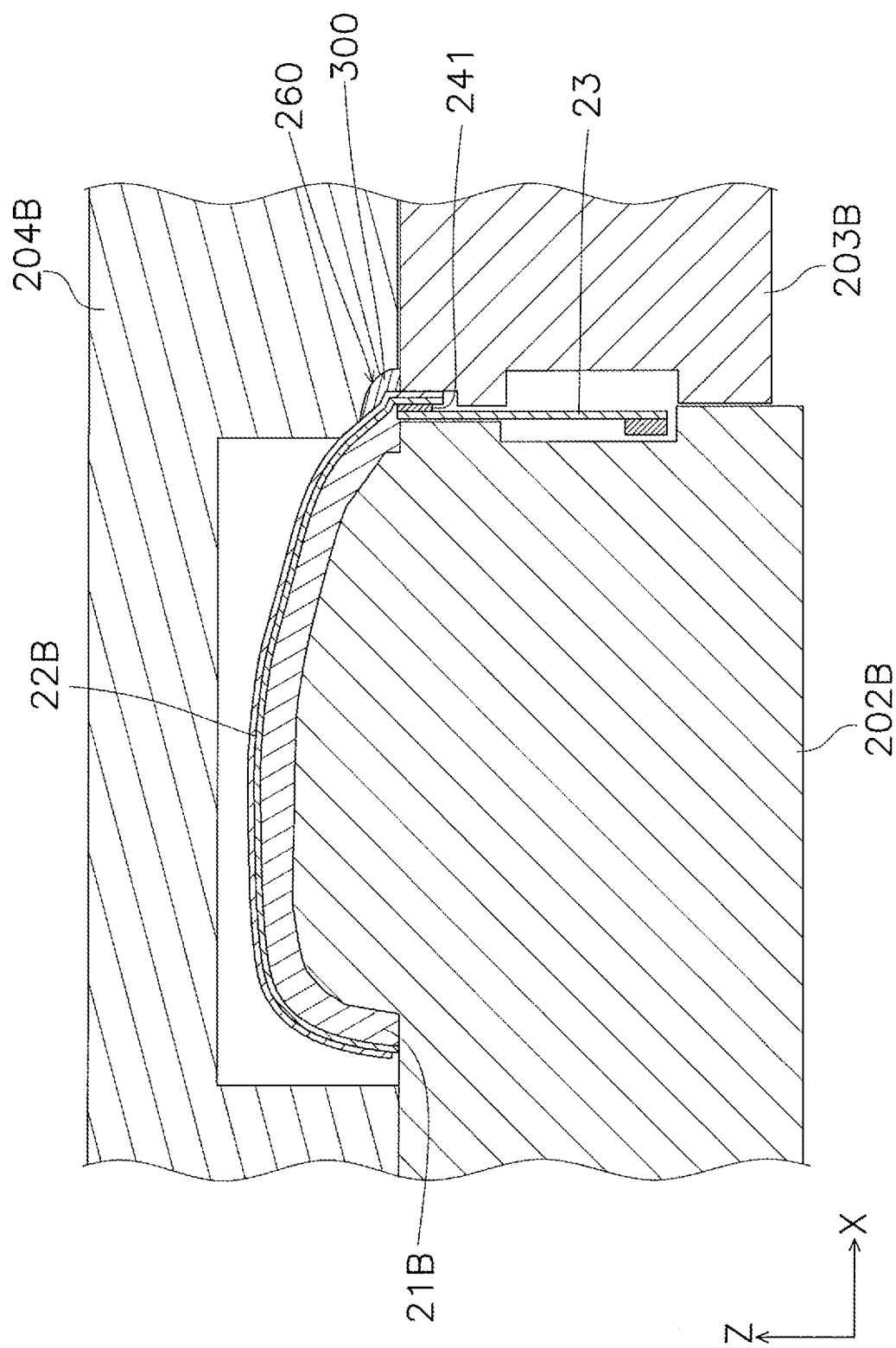
FIG. 23 is a partially enlarged cross-sectional view of clamped second mold to fourth mold.

In addition, even with the use of the lead portion 22Ce in this manner, the lead portion 22Ce can be fixed with the fixing portion by applying the manufacturing method described with reference to FIG. 23.

(10) FEATURES 10-1

As described above, the molded article 21, 21A, or 21B includes the main body 31, 31A, or 31B made of resin and the standing wall 32, 32A, or 32B made of resin. A part of the FPC 23 electrically connected to the conductive circuit layer 42 is embedded into and integrated with the standing wall 32, 32A, or 32B, which integrally stands up from the end portion 31c, 31Ac, or 31Bc of the main body 31, 31A, or 31B. Since a part of the FPC 23 is embedded and integrated, the decorative sheet 22 or 22B on the front surface side of the FPC 23 is less likely to be uplifted by the FPC 23. Additionally, the FPC 23 is firmly fixed to the molded article 21, 21A, or 21B, and the positional relationship between the FPC 23 and the conductive circuit layer 42 is also less likely to shift. Suppressing the uplift of the decorative sheet 22 or 22B improves the aesthetic appearance. Additionally, since the positional relationship between the FPC 23 and the conductive circuit layer 42 is less likely to shift, disconnection is less likely to occur.

10-2

The electrical connecting part between the FPC 23 and the conductive circuit layer 42 is laminated on the wall front surface 32a, 32Aa, or 32Ba. For example, the anisotropic conductive film 24 is disposed on this electrical connecting part between the FPC 23 and the conductive circuit layer 42, and thus a surface undulation is easily formed. There may be a case where a persons eyes catch a relatively small surface undulation and the person determines that the appearance is aesthetically degraded; however, disposing such electrical connecting part on the side of the standing wall 32, 32A, or 32B allows the aesthetically improved appearance of the surface of the main body front surface 31a, 31Aa, or 31Ba.

10-3

The conductive circuit layer 42 includes, for example, an electrode of a sensor, such as the electrode of the touch sensor 51. The sensitivity of the sensor is easily set to high as the electrode becomes close to the front surface. For example, compared with a case where the electrode of the touch sensor is formed on the main body back surface 31b of the molded article 21, the sensitivity becomes higher in the case where the electrode of the touch sensor 51 is included in the conductive circuit layer 42 on the side of the main body front surface 31a.

10-4

As described with reference to FIGS. 3 and 4, the decorative sheet 22 and the FPC 23 are wrapped around and fixed so as to be inclined inward with respect to the inclined direction of the wall front surface 32a of the standing wall 32. The reason that the decorative sheet 22 and the FPC 23 can be thus wrapped around and fixed so as to be inclined inward is that the front surface side end portion 32c of the standing wall 32 is inclined inward with respect to the inclined direction of the wall front surface 32a. With the FPC 23 thus wrapped around and fixed using the front surface side end portion 32c inclined inward, the bending of the FPC 23 is reduced and the disconnection is less likely to occur, and with the decorative sheet 22 thus wrapped around and fixed, the decorative sheet 22 is less likely to be turned up.

10-5

The fixing portion 35 or 35B made of resin annularly covers the FPC 23 together with the molded article 21A or 21B in at least a part of the FPC 23. For example, compared with the molded product 20, with the presence of this fixing portion 35 or 35B, stress is less likely to be applied from outside the molded product 20A or 20B to the FPC 23. Additionally, even when stress is applied from the outside to the FPC 23, the FPC 23 and/or the decorative sheet 22 is less likely to be damaged in the molded product 20A or 20B compared with the molded product 20. Note that a part of the FPC 23 is embedded into the molded article 21A or 21B in the location where the fixing portion 35 or 35B is formed. Thus, the configuration in which a part of the FPC 23 is embedded into the molded article 21A or 21B is also included in the configuration in which a part of the FPC 23 is embedded into and integrated with the standing wall 32A or 32B.

10-6

The video camera 10 as the example of the electrical product includes the molded product 20 and the controller 55 as the electrical device. The molded product 20 constituting the video camera 10 can be exchanged by the above-described molded products 20A to 20C. The electrical product provided with the molded product 20 or 20A to 20C is advantageous in the aesthetic appearance and the less likely occurrence of disconnection.

10-7

The method for manufacturing the molded product 20 or 20A to 20C preforms the decorative sheet 22, 22B, or 22C to the shape close to the shape of the molded product 20 or 20A to 20C. Next, the decorative sheet 22, 22B, or 22C is set in the recess portion 210 of the first mold 201 or 201B such that the base film 411 in the front surfacing layer 41 faces the first mold 201 or 201B, and the FPC 23, which is the external connecting portion for connecting the conductive circuit layer 42 to an external electrical circuit, or the lead portion 22Ce as the external connecting portion is disposed on an extension of a peripheral wall 211 of the recess portion 210. The first mold 201 or 201B, the second mold 202, 202A, or 202B, and the third mold 203, 203A, or 203B is clamped, the FPC 23 or the lead portion 22Ce is protruded from the first cavity 250 or 250B formed with the recess portion 210 to the external space outside the first cavity 250 or 250B, and the FPC 23 or the lead portion 22Ce is sandwiched between the second mold 202, 202A, or 202B and the third mold 203, 203A, or 203B. The molten resin 300 is injected into the first cavity 250 or 250B, thus molding the molded article 21 or 21A to 21C integrated with the decorative sheet 22, 22B, or 22C.

Such a method for manufacturing the molded product 20, or 20A to 20C does not mold the FPC 23 or the lead portion 22Ce bent at a small radius of curvature, and thus disconnection is less likely to occur. Additionally, the uplift of the decorative sheet 22, 22B, or 22C is suppressed; therefore, the appearance is aesthetically improved.

10-8

The manufacturing method described with reference to FIGS. 8A to 8F electrically connects the FPC 23 to the conductive circuit layer 42 with the anisotropic conductive film 24 by the temperature and the pressure at which the shape of the preformed decorative sheet 22 is not lost and fixes the FPC 23 to the decorative sheet 22, thus forming the external connecting portion. Since the thus preformed shape can be made close to the shape of the recess portion 210, a defect during injection molding, such as generation of a crease due to being pulled by the molten resin 300 and an entrance of the molten resin 300 between the first mold 201 and the decorative sheet 22, can be suppressed.

10-9

As described in the second embodiment and the modified example 3A, in the case where the fixing portion 35 or 35B is formed, after the molded article 21 or 21B is formed, the second cavity 260 is formed on the surface of the FPC 23 or the lead portion 22Ce as the external connecting portion and the wall front surface 32Aa or 32Ba with the fourth mold 204 or 204B, and the molten resin 300 is injected into the second cavity 260. The fixing portion 35 or 35B made of resin that annually covers at least a part of the FPC 23 or the lead portion 22Ce as the external connecting portion together with the molded article 21 or 21B is formed. The manufacturing methods described in the second embodiment and the modified example 3A open the first mold 201 or 201B and clamp the fourth mold 204 or 204B. As a result, other molds such as the second mold 202 or 202B and the third mold 203 or 203B can be doubled. Thus, the fixing portion 35 or 35B can be formed at a low cost.

10-10

As described with reference to FIGS. 9 to 13, the method for manufacturing the molded product 20 preforms the decorative sheet 22 to the shape close to the shape of the molded product 20. Next, the decorative sheet 22 is set in the recess portion 210 of the first mold 201 so that the decorative sheet 22 faces the first mold 201, and the extension portion 22c of the decorative sheet 22 extending from the peripheral edge portion 22b of the decorative sheet 22 is disposed on the wall front surface 32a. By clamping the first mold 201, the second mold 202, and the third mold 203, the expansion portion 22d, which is in the vicinity of the boundary between the peripheral edge portion 22b and the extension portion 22c, is sandwiched between the second mold 202 and the third mold 203. The molten resin 300 is injected into the first cavity 250, and thus the molded article 21 integrated with the decorative sheet 22 is molded. Such a method for manufacturing the molded product 20 suppresses a bleed of the resin, and this allows making it difficult to cause disconnection in the conductive circuit layers 42 and/or the FPC 23 due to the bleed of the resin. Additionally, the uplift of the decorative sheet 22 due to the bleed is suppressed; therefore, the appearance is aesthetically improved.

10-11

As described in the second embodiment, in the case where the fixing portion 35 is formed, after the molded article 21 is formed, the second cavity 260 is formed on the surface of the FPC 23 or the lead portion 22Ce as the external connecting portion and the wall front surface 32Aa or 32Ba with the fourth mold 204, and the molten resin 300 is injected into the second cavity 260. The fixing portion 35 made of resin that annually covers at least a part of the extension portion 22c together with the molded article 21 is formed. The manufacturing method described in the second embodiment opens the first mold 201 and clamps the fourth mold 204. As a result, other molds such as the second mold 202 and the third mold 203 can be doubled. Thus, the fixing portion 35 can be formed at a low cost.

REFERENCE CHARACTER LIST

10 Video camera (example of electrical product)
20, 20A to 20C Molded product
21, 21A to 21C Molded article
22, 22B, 22C Decorative sheet
22a, 22Ba, 22Ca Base portion
22b, 22Bb, 22Cb Peripheral edge portion
22c Extension portion
22d Expansion part
22Ce Lead portion (example of external connecting portion)
23 Flexible printed circuit board (example of external connecting portion)
24 Anisotropic conductive film
31, 31A to 31C Main body
31a, 31Aa to 31Ca Main body front surface
31b, 31Ab to 31Cb Main body back surface
32, 32A to 32C Standing wall
32a, 32Aa, 32Ba Wall front surface
32c Front surface side end portion
35, 35B Fixing portion
41 Front surfacing layer
42 Conductive circuit layer
51 Touch sensor (example of sensor)
52 Membrane switch
55 Controller (example of electrical device)
201, 201B First mold
202, 202A, 202B Second mold
203, 203A, 203B Third mold
204, 204B Fourth mold
210 Recess portion
211 Peripheral wall
250, 250B First cavity
260 Second cavity
300 Molten resin

The invention claimed is:

1. A molded product comprising:
    a molded article that includes a main body made of resin and a standing wall made of resin, the standing wall integrally standing up from an end portion of the main body;
    a decorative sheet that includes a base film and a conductive circuit layer, the base film continuously covering from a main body front surface of the main body to a wall front surface of the standing wall, the conductive circuit layer being disposed between the base film and a molded article front surface of the molded article, the decorative sheet being integrated with the molded article to implement a decoration; and
    a flexible printed circuit board disposed between the molded article and the conductive circuit layer, the flexible printed circuit board being partially embedded into and integrated with the standing wall, the flexible printed circuit board being electrically connected to the conductive circuit layer.

2. The molded product according to claim 1, wherein an electrical connecting part for the flexible printed circuit board and the conductive circuit layer are laminated on the wall front surface.

3. The molded product according to claim 1, wherein the conductive circuit layer includes an electrode of a sensor.

4. The molded product according to claim 1, wherein the decorative sheet and the flexible printed circuit board are wrapped around and fixed so as to be inclined inward with respect to an inclined direction of the wall front surface.

5. The molded product according to claim 1, further comprising:
    a fixing portion made of resin that annularly covers the flexible printed circuit board together with the molded article in at least a part of the flexible printed circuit board.

6. An electrical product comprising:
    the molded product according to claim 1; and
    an electrical device electrically connected to the flexible printed circuit board of the molded product.

7. A method for manufacturing the molded product of claim 1, the method comprising:
    preforming the decorative sheet in a shape close to a shape of the molded article;
    setting the decorative sheet in a recess portion of a first mold such that the base film faces the first mold and disposing an external connecting portion for connecting the conductive circuit layer to an external electrical circuit on an extension of a peripheral wall of the recess portion;
    clamping the first mold, a second mold, and a third mold, protruding the external connecting portion from a first cavity formed with the recess portion to an external space outside the first cavity, and sandwiching the external connecting portion between the second mold and the third mold; and
    injecting molten resin into the first cavity to form the molded article integrated with the decorative sheet.

8. The method for manufacturing the molded product according to claim 7, comprising:
    forming the external connecting portion by electrically connecting the flexible printed circuit board to the conductive circuit layer with an anisotropic conductive film with a temperature and a pressure at which a shape of the preformed decorative sheet is kept, and fixing the flexible printed circuit board to the decorative sheet.

9. The method for manufacturing the molded product according to claim 7, comprising:
    forming a second cavity on a front surface of the external connecting portion and the wall front surface with a fourth mold to inject molten resin into the second cavity so as to form a fixing portion made of resin, the fixing portion annually covering at least a part of the external connecting portion together with the molded article.

10. A method for manufacturing the molded product of claim 1, the method comprising:
    preforming the decorative sheet in a shape close to a shape of the molded article;
    setting the decorative sheet in a recess portion of a first mold such that the decorative sheet faces the first mold and disposing an extension portion of the decorative sheet extending from a peripheral edge portion of the decorative sheet on the wall front surface;
    clamping the first mold, a second mold, and a third mold to form a first cavity with the recess portion, and sandwiching a vicinity of a boundary between the peripheral edge portion and the extension portion between the second mold and the third mold; and
    injecting molten resin into the first cavity to form the molded article integrated with the decorative sheet.

11. The method for manufacturing the molded product according to claim 10, further comprising:
    forming a second cavity on a surface of the extension portion and the wall front surface with a fourth mold to inject molten resin into the second cavity so as to form a fixing portion made of resin, the fixing portion annularly covering at least a part of the extension portion together with the molded article.

* * * * *